(12) United States Patent
Zhang

(10) Patent No.: US 6,603,160 B1
(45) Date of Patent: Aug. 5, 2003

(54) MOS CAPACITOR, LIQUID CRYSTAL DISPLAY, INTEGRATED CIRCUIT AND METHOD OF MANUFACTURE THEREOF

(75) Inventor: Hongyong Zhang, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 0 days.

(21) Appl. No.: 09/582,683

(22) PCT Filed: Oct. 29, 1999

(86) PCT No.: PCT/JP99/06029

§ 371 (c)(1),
(2), (4) Date: Aug. 28, 2000

(87) PCT Pub. No.: WO00/26970

PCT Pub. Date: May 11, 2000

(30) Foreign Application Priority Data

Oct. 30, 1998 (JP) ............................................ 10-311249

(51) Int. Cl.[7] ............................................... H01L 29/78
(52) U.S. Cl. .......................... 257/288; 257/298; 349/38; 349/43
(58) Field of Search ................................ 257/288, 298, 257/347–353, 49–57, 532; 345/207; 349/42–43, 38–39; 361/303, 305, 306.1

(56) References Cited

U.S. PATENT DOCUMENTS

| 4,305,083 A | * 12/1981 | Gutierrez ..................... 257/298 |
| 4,814,842 A | * 3/1989 | Nakagawa et al. ........... 257/65 |
| 5,341,009 A | * 8/1994 | Young et al. ................ 257/296 |
| 5,965,928 A | * 10/1999 | Nagura ....................... 257/532 |
| 6,097,453 A | * 8/2000 | Okita .......................... 349/43 |
| 6,187,605 B1 | * 2/2001 | Takasu et al. ................. 438/29 |

FOREIGN PATENT DOCUMENTS

| JP | 57005372 A | * 1/1982 | ................. 438/705 |
| JP | 1276766 | 11/1989 | |
| JP | 2246160 | 10/1990 | |
| JP | 8328034 | 12/1996 | |
| JP | 10270956 | 10/1998 | |

* cited by examiner

Primary Examiner—Minh Loan Tran
Assistant Examiner—Thomas L. Dickey
(74) Attorney, Agent, or Firm—Greer, Burns & Crain, Ltd.

(57) ABSTRACT

A MOS capacitor used in an active matrix liquid crystal display is manufactured by a process comprising the steps of forming capacitor electrodes with a dielectric layer between them in a semiconductor layer, forming a p+ diffused region and an n+ diffused region adjacent to the capacitor electrodes in the semiconductor layer, and making a complementary connection between the regions.

14 Claims, 21 Drawing Sheets

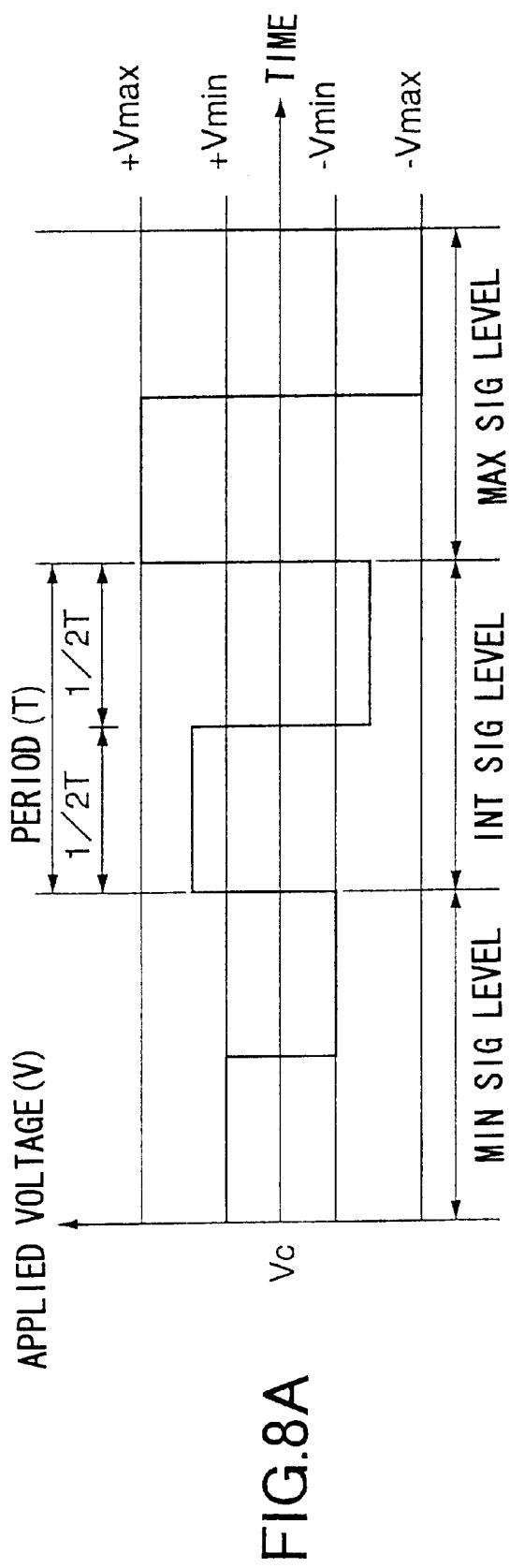
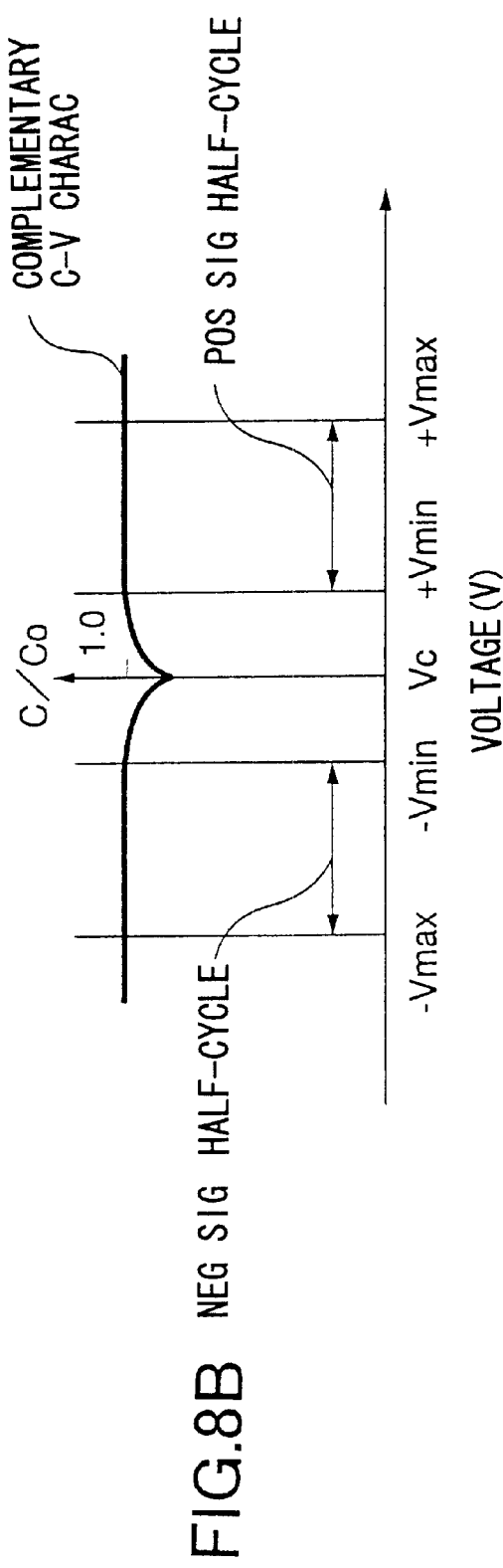
FIG.8A
FIG.8B

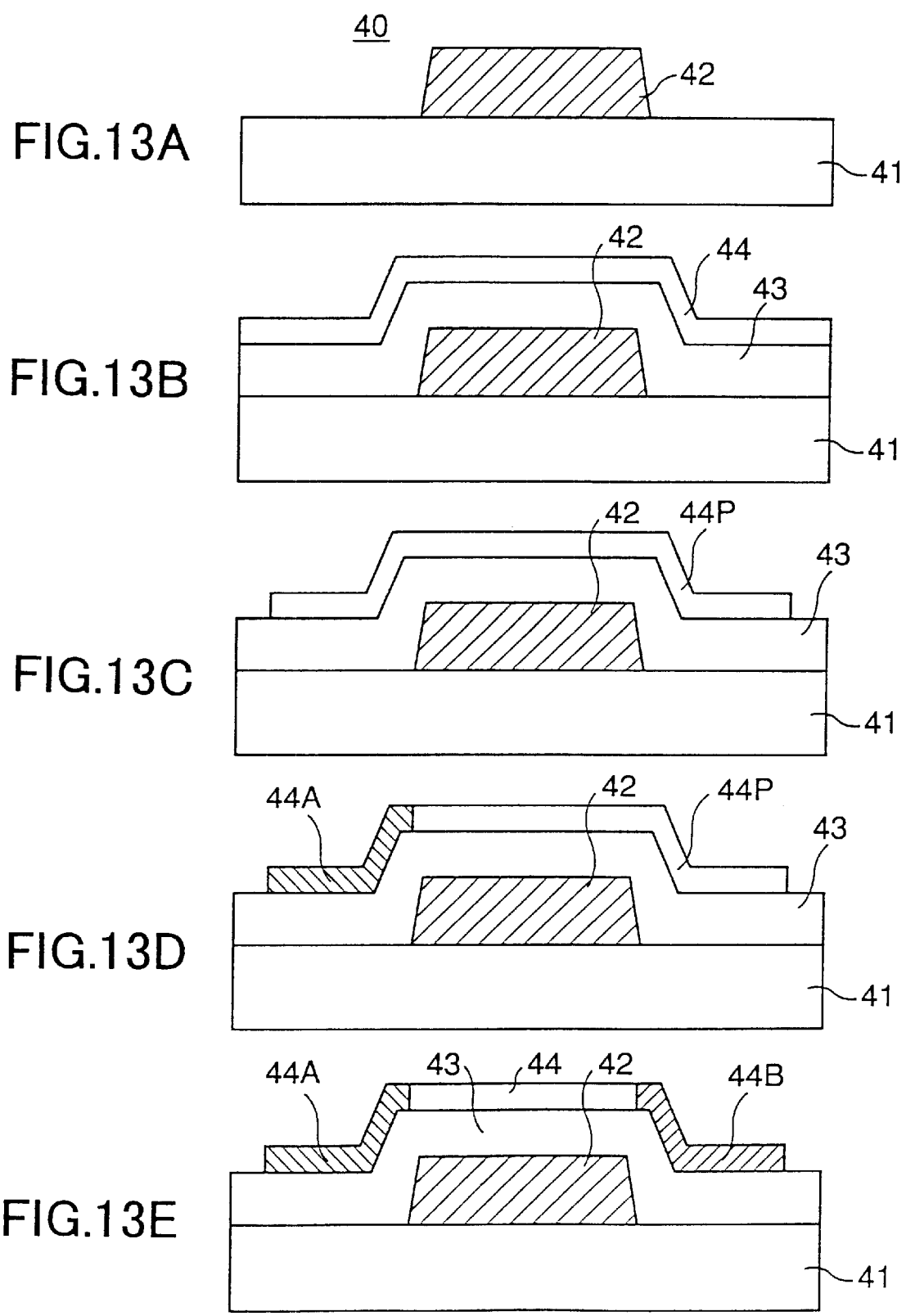

MOS CAPACITOR, LIQUID CRYSTAL DISPLAY, INTEGRATED CIRCUIT AND METHOD OF MANUFACTURE THEREOF

TECHNICAL FIELD

The present invention generally relates to liquid crystal display devices, and more particularly to a liquid crystal display device having a MOS (metal-oxide-semiconductor) capacitor and a fabrication process thereof. Further, the present invention relates to such a MOS capacitor, a semiconductor device having such a MOS capacitor, and a fabrication process of those.

Conventionally, liquid crystal display devices have been used widely in portable information processing apparatuses such as so-called notebook computer, as a low-power-consuming compact information display device.

On the other hand, application of a liquid crystal display device is by no means limited to such a portable information processing apparatus. Today, liquid crystal display devices are used also in desk-top type information processing apparatuses as replacement of conventional CRT display device. Further, liquid crystal display devices are attractive as a display device of high-definition televisions (HDTV). Particularly, application to a projection-type HDTV display device is studied.

In the case of such high-performance, large-area liquid crystal display devices, a simple matrix driving construction used conventionally cannot provide satisfy the required specification in terms of response speed, contrast ratio, color purity, and the like. Thus, in such high-performance, large-area liquid crystal display devices, an active-matrix driving method is used in which each pixel is driven by a corresponding thin-film transistor (TFT). In the liquid crystal display device that employs an active-matrix driving method, it has been practiced to use an amorphous silicon liquid crystal display device in which amorphous silicon is used for the active region of the TFT. On the other hand, amorphous silicon has a drawback of small electron mobility and cannot satisfy the specification required for such a high-performance liquid crystal display device. Thus, there is a need of using a polysilicon TFT as the TFT of a high-performance liquid crystal display device.

Generally, a liquid crystal display device that uses the active matrix driving uses a capacitor for each TFT for retaining a driving voltage applied to a liquid crystal layer. Such a capacitor may be formed by a dielectric film sandwiched by a pair of metal electrodes similarly to ordinary capacitors. On the other hand, in view of the fact that the capacitor is used in cooperation with a highly miniaturized TFT, it is advantageous to construct the capacitor to have a so-called MOS structure.

BACKGROUND ART

FIG. 1 shows the general construction of a conventional active-matrix driven liquid crystal display device.

Referring to FIG. 1, the liquid crystal display device includes a TFT glass substrate 1A carrying thereon a number of TFTs and transparent pixel electrodes cooperating thereto and an opposing glass substrate 1B formed on the TFT substrate 1A. Between the substrate 1A and the substrate 1B, a liquid crystal layer 1 is confined by means of a seal member 1C. In the illustrated liquid crystal display device, the transparent pixel electrodes are selectively driven via a corresponding TFT and the orientation of liquid crystal molecules is changed selectively in the liquid crystal layer in correspondence to the selected pixel electrode. Further, polarizers not illustrated are disposed at respective outer sides of the glass substrates 1A and 1B. Further, a molecular alignment film not illustrated is formed on the inner sides of the glass substrates 1A and 1B in contact with the liquid crystal layer 1. The molecular alignment film thereby restricts the orientation of the liquid crystal molecules.

FIG. 2 shows a part of the TFT glass substrate 1A in an enlarged scale.

Referring to FIG. 2, the glass substrate 1A carries thereon a number of pad electrodes 13A, to which a scanning signal is supplied, and a number of scanning electrodes 13 extend therefrom, wherein the glass substrate 1A further carries thereon a number of pad electrodes 12A, to which a video signal is supplied, and a number of signal electrodes 12 extend therefrom. The scanning electrodes 13 and the signal electrodes 12 extend in such a manner that an elongating direction of a scanning electrode 13 intersects generally perpendicularly to an elongating direction of a signal electrode 12. Further, TFTs 11 are formed at the intersections of the scanning electrodes 13 and the signal electrodes 12. Further, the substrate 1A carries transparent pixel electrodes 14 thereon such that a pixel electrode 14 corresponds to each of the TFTs 11, and each TFT 11 is selected by a scanning signal on a corresponding scanning electrode 13. Thereby, the selected TFT 11 drives the cooperating transparent pixel electrode 14 by a video signal on the corresponding signal electrode 12.

FIG. 3 shows the construction of a liquid crystal cell driving circuit for driving one pixel of the liquid crystal display device of FIG. 2.

Referring to FIG. 3, a number of liquid crystal cells 15 are formed in the liquid crystal layer 1 of FIG. 1 in correspondence to the plurality of pixels, and it can be seen that a number of the TFTs 11 are formed on the TFT substrate, which corresponds with the glass substrate 1A of FIG. 1, in a row and column formation in correspondence to the liquid crystal cells 15. Further, it can be seen that the signal lines 12 supplying the video signals to the TFTs 11 extend on the TFT substrate 1A in a column direction in a substantially parallel relationship with each other. Further, it can be seen that the gate electrodes (scanning electrodes) 13 controlling the TFTs 11 extend substantially parallel with each other. In the illustrated example, a TFT 11 is formed of a pair of serially connected TFTs 11A and 11B and drives the corresponding liquid crystal cell 15 via the pixel electrode 14. Further, a capacitor 16 is connected to the TFT 11 parallel to the liquid crystal cell 15. The capacitor 16 thereby constitutes an accumulating capacitance holding the driving voltage applied to the liquid crystal cell 15. In the construction, the capacitor 16 is connected between the pixel electrode 14 and a capacitance line 17.

As explained before, the accumulating capacitance 16 may be constructed by sandwiching a dielectric film between a pair of metal electrode patterns. In the case of an active-matrix driven liquid crystal display device, however, it is more advantageous to construct the same in the form of a MOS capacitor.

FIG. 4 shows the circuit construction of a conventional liquid display device that has such a MOS capacitor.

Referring to FIG. 4, the liquid crystal cell is formed of a glass substrate 10A corresponding to the foregoing TFT substrate 1A, a polysilicon pattern 10B formed on the glass substrate 10A, and an oxide film 10C formed on the glass substrate 10A so as to cover the polysilicon pattern 10B. The TFT 11 is formed of n⁺-type diffusion regions 10a, 10b and 10c formed in the foregoing polysilicon pattern 10B, a gate electrode 11a of Al or polysilicon formed on the oxide film 10C between the foregoing diffusion regions 10a and 10b, and a gate electrode 11b formed similarly of Al or polysilicon on the oxide film 10C between the diffusion regions 10b and 10c. It should be noted that the gate electrode 11a corresponds to the foregoing TFT 11A and the gate electrode 11b corresponds to the foregoing TFT 11B. Further, the oxide film 10C constitutes a gate insulation film underneath the gate electrodes 11a and 11b. Further, the signal line 12 is connected to the diffusion region 10a and the gate control line 13 is connected to the gate electrodes 11a and 11b.

In the construction of FIG. 4, it can be seen that the diffusion region 11c extends in the right direction in the drawing and forms an n⁺-type diffusion region 10d. Further, an electrode 11c of Al or polysilicon is formed on the oxide film 10C in correspondence to the diffusion region 10d similarly to the gate electrodes 11a and 11b, wherein the electrode 11c thus formed constitutes a capacitor electrode of the foregoing capacitor 16.

In the liquid crystal display device of such a construction, the TFTs 11A and 11B are turned on in response to the selection signal on the gate bus line 13 and the capacitor 16 is charged by the video signal on the signal line 12 via the diffusion region 10d. As a result, the potential of the pixel electrode 14 connected to the diffusion region 10c and the diffusion region 10d is maintained at a predetermined driving level until the next selection signal comes in.

On the other hand, such a conventional liquid crystal display device has a drawback in the point that, while it allows a self-aligned formation of the diffusion regions 10a, 10b and 10c by using the gate electrodes 11a and 11b as a mask, does not allow a self-aligned formation for the diffusion region 10d. Thus, in order to form the diffusion region 10d, it is necessary to conduct an ion implantation process separately to the diffusion regions 10a–10c by using a separate mask.

However, the use of such a separate mask process and separate ion implantation process for forming the diffusion region 10d increases the number of fabrication steps significantly. Further, there is a risk of mask alignment error, which may lead to the problems such as variation of the threshold value or increase of number of the defective devices. In the construction of FIG. 2, it is possible to abandon the use of self-alignment process for forming the diffusion regions 10a–10c and use the same mask process used for forming the diffusion region 10d. However, such a process has a drawback, due to the fact that the formation of the oxide film 10C is conducted after the ion implantation process, that the surface of the polysilicon pattern 10B is tend to be contaminated by impurity elements. In the case of fabricating a semiconductor integrated circuit, such impurity elements can be eliminated by conducting a cleaning process. In the case of a liquid crystal display device that uses a glass substrate, on the other hand, thorough cleaning process cannot be used and the impurity elements tend to remain on the polysilicon pattern once the impurity element has caused a contamination.

FIG. 5 shows the construction of another conventional liquid crystal display device that eliminates the problem of the liquid crystal display device of FIG. 4. In FIG. 5, those parts corresponding to the parts described previously are designated by the same reference numerals and the description thereof will be omitted.

Referring to FIG. 5, the illustrated liquid crystal display device includes an n⁺-type diffusion region 10e in the polysilicon pattern 10B in addition to the n⁺-type diffusion regions 10a–10c constituting the TFTs 11A and 11B, by a self-alignment process that uses the gate electrodes 11a, 11b and the capacitor electrode 11c as a mask. Thus, the problems of increased number of fabrication steps and the contamination of the polysilicon pattern 10B by impurity element are avoided. In the construction of FIG. 3, a predetermined voltage is applied to the electrode 11c via the capacitance line 17 and a surface accumulation layer is inducted in the polysilicon pattern 10B in the intrinsic or low-doped region 10f between the diffusion regions 10c and 10e. It should be noted that the region 10f has an impurity concentration similar to the channel region formed in the polysilicon pattern 10B between the diffusion regions 10a and 10b or between the diffusion regions 10c and 10d.

Thus, the construction of FIG. 5 can avoid the problem pertinent to the construction of FIG. 4. On the other hand, the construction of FIG. 5 requires another power source for driving the capacitance line 17 and for inducing a surface accumulation layer in the region 10f, and the construction of the driving circuit of the liquid crystal becomes complex. Thereby, the problem of increase of the manufacturing cost cannot be avoided. Further, as can be seen from the circuit diagram of FIG. 3, the capacitance line 17 thus applied with a high voltage crosses the signal line on the TFT substrate 10F. As there exists only a thin interlayer insulation film between the capacitance line 17 and the signal line 12, there is a risk that a leakage current or breakdown of insulation occurs. It should be noted that the voltage applied to the capacitance line 17 is a voltage much higher than the voltage used commonly in an ordinary semiconductor integrated circuit. Further, in view of the fact that the high voltage is applied continuously to the capacitance line 17, the gate oxide film 10C tends to degrade more than a gate oxide film used in an ordinary MOS transistor. Thus, the capacitor 16 of FIG. 5 has a drawback in terms of reliability.

Further, the construction of FIG. 5 has a drawback, associated with the application of high voltage to the capacitance line 17, in that there tend to be formed domains in the liquid crystal cell in correspondence to the capacitance line and other wiring or TFT. In order to avoid disturbance of representation associated with such a domain formation, it is necessary to provide an opaque mask along the capacitance line with a substantial width. However, formation of such a wide opaque mask causes a decrease of aperture ratio of the liquid crystal display device.

DISCLOSURE OF THE INVENTION

Accordingly, it is a general object of the present invention to provide a novel and useful MOS-type capacitance device, a liquid crystal display device, a semiconductor device, and a fabrication process thereof, wherein the foregoing problems are eliminated.

Another and more specific object of the present invention is to provide a MOS-type capacitance device having a simple construction for easiness of fabrication, a liquid crystal display device having such a MOS-type capacitance device, and a fabrication process thereof.

Another object of the present invention is to provide a MOS-type capacitance device, characterized by:
   a substrate,
   a semiconductor layer formed on the substrate,
   an insulating film formed on the semiconductor layer,
   an electrode formed on the insulating film,
   a first diffusion region formed in the semiconductor layer adjacent to the electrode, and a second diffusion region formed in the semiconductor layer adjacent to the electrode, the first diffusion region being doped to a first conductivity type, the second diffusion region being doped to a second, opposite conductivity type.

Another object of the present invention is to provide a MOS-type capacitance device, characterized by:

a substrate, an electrode formed on the substrate, an insulating film formed on the substrate so as to cover the electrode, a semiconductor layer formed on the insulating film, a first diffusion region formed in the semiconductor layer adjacent to a first edge of the electrode, a second diffusion region formed in the semiconductor layer adjacent to another edge of the electrode, the first diffusion region being doped to a first conductivity type, the second diffusion region being doped to a second, opposite conductivity type.

According to the present invention, the MOS-type capacitance device shows substantially the same capacitance with regard to a positive voltage or a negative voltage, or with regard to a low-frequency signal or a high-frequency signal, by forming a complementary connection. The MOS-type capacitance device thereby performs as an effective capacitor. Further, the MOS-type capacitance device of the present invention can be formed simultaneously with the fabrication process of other MOS transistors, without adding fabrication steps. In the MOS-type capacitance device of the present embodiment, the type diffusion region and the $p^+$-type diffusion region are formed by conducting an ion implantation process after covering the semiconductor layer by the insulating film. Thereby, the problem of contamination of the semiconductor layer by impurity elements occurring in the conventional art is eliminated. Associated with this, the problem of variation of the threshold voltage or other operational characteristics, caused in the transistors that are formed on the semiconductor layer simultaneously to the MOS-type capacitance device, as a result of the contamination of the impurity elements, is eliminated. When the MOS-type capacitance device of the present invention is used for driving a liquid crystal display device, the capacitor electrode may be simply held at a common potential level. Thereby, the stress applied to the capacitor insulation film or other interlayer insulation film is reduced and the degradation of display characteristics arising from the stress is avoided.

Another object of the present invention is to provide a liquid crystal display device, characterized by:

a first glass substrate, a second glass substrate opposing the first glass substrate, a liquid crystal layer confined between the first glass substrate and the second glass substrate, a signal electrode extending on the first glass substrate, a scanning electrode extending on the first glass substrate, a common potential line extending on the first glass substrate, a thin-film transistor formed at an intersection of the signal electrode line and the scanning electrode, a pixel electrode electrically connected to the thin-film transistor, and an accumulating capacitance connected parallel to the pixel electrode, the thin-film transistor being formed in a semiconductor layer formed on the first glass substrate, the accumulating capacitance comprising:

an insulating film formed on the semiconductor layer, a capacitor electrode formed on the insulating film, a first diffusion region formed in the semiconductor layer adjacent to the capacitor electrode, and a second diffusion region formed in the semiconductor layer adjacent to the capacitor electrode, the first diffusion region being doped to a first conductivity type, the second diffusion region being doped to a second, opposite conductivity type.

According to the present invention, it is possible to reduce the manufacturing cost of the liquid crystal display device by using the MOS-type capacitance device in the liquid crystal display device. Further, the liquid crystal display device has an advantageous feature of improved reliability and high yield of production due to reduction of stress applied to a gate insulation film, the capacitor insulation film or other interlayer insulation films.

Another object of the present invention is to provide a projection-type liquid crystal display device, characterized by:

an optical source, a liquid crystal panel disposed in an optical path of an optical beam produced by the optical source for spatial modulation, and a projecting optical system projecting the optical beam that has been spatially modulated by the liquid crystal panel, the liquid crystal panel comprising:

a first glass substrate, a second glass substrate opposing the first glass substrate, a liquid crystal layer confined between the first glass substrate and the second glass substrate, a signal electrode extending on the first glass substrate, a scanning electrode extending on the second glass substrate, a common potential line extending on the first glass substrate, a thin-film transistor formed at an intersection of the signal electrode line and the scanning electrode, a pixel electrode electrically connected to the thin-film transistor, and an accumulating capacitance connected parallel to the pixel electrode, the thin-film transistor being formed in a semiconductor layer formed on the first glass substrate, the accumulating capacitance comprising:

an insulating film formed on the semiconductor layer, a capacitor electrode formed on the insulating film, a first diffusion region formed in the semiconductor layer adjacent to the capacitor electrode, and a second diffusion region formed in the semiconductor layer adjacent to the capacitor electrode, the first diffusion region being doped to a first conductivity type, the second diffusion region being doped to a second, opposite conductivity type.

According to the present invention, it becomes possible to manufacture a projection-type liquid crystal display device using a MOS-type capacitance device at low cost without increasing the number of manufacturing steps. The liquid crystal display device has an advantageous feature of improved reliability and high yield of production due to reduction of stress applied to a gate insulation film, the capacitor insulation film or other interlayer insulation films.

Another object of the present invention is to provide a semiconductor integrated circuit device having a capacitor, the capacitor comprising a substrate, an insulating film formed on the substrate, an electrode formed on the insulating film, a first diffusion region formed in the substrate adjacent to the electrode, and a second diffusion region formed in the substrate adjacent to the electrode, characterized in that the first diffusion region is doped to a first conductivity type and the second diffusion region is doped to a second, opposite conductivity type.

According to the present invention, various semiconductor integrated circuits can be manufactured by using the MOS-type capacitance device.

Another object of the present invention is to provide a method of fabricating a MOS-type capacitance device, characterized by the steps of:

forming a semiconductor film on a substrate, forming an insulating film on the semiconductor film, forming a gate electrode on the insulating film, introducing an impurity element of a first conductivity type into the semiconductor film at a first side of the gate electrode while using the gate electrode as a mask, and introducing an impurity element of a second, opposite conductivity type into the semiconductor film at another side of the gate electrode while using the gate electrode as a mask.

Another object of the present invention is to provide a method of fabricating a liquid crystal display device having a MOS-type capacitance, characterized in that the MOS-type capacitance is fabricated according to the steps of:

forming a semiconductor film on a glass substrate, forming an insulating film on the semiconductor film, forming a gate electrode on the semiconductor film, introducing an impurity element of a first conductivity type into the semiconductor film at a first side of the gate electrode while using the gate electrode as a mask, and introducing an impurity element of a second, opposite conductivity type into the semiconductor film at another side of the gate electrode while using the gate electrode as a mask.

Another object of the present invention is to provide a method of fabricating a liquid crystal display device having a MOS-type capacitance device, characterized in that the MOS-type capacitance device is fabricated according to the steps of:

forming a capacitor electrode on a glass substrate, forming an insulating film on the glass substrate so as to cover the capacitor electrode, forming a semiconductor film on the insulating film, introducing an impurity element of a first conductivity type into the semiconductor film at a first side of the gate electrode, and introducing an impurity element of a second, opposite conductivity type into the semiconductor film at another side of the gate electrode.

Another object of the present invention is to provide a method of fabricating a semiconductor integrated circuit device having a MOS-type capacitance device, characterized in that the MOS-type capacitance device is fabricated according to the steps of:

forming an insulating film on the semiconductor substrate, forming a gate electrode on the insulating film, introducing an impurity element of a first conductivity type into the semiconductor substrate at a first side of the gate electrode while using the gate electrode as a mask, and introducing an impurity element of a second conductivity type into the semiconductor substrate at another side of the gate electrode while using the gate electrode as a mask.

According to the present invention, it becomes possible to fabricate a MOS-type capacitance device, or a liquid crystal display device using the same, or a semiconductor integrated circuit device using the same.

BRIEF DESCRIPTION OF THE DRAWINGS

FIGS. 8A and 8B are further diagrams explaining the principle of the present invention;

FIGS. 13A–13E are diagrams showing the fabrication process of a MOS-type capacitance device according to a second embodiment of the present invention;

BEST MODE OF IMPLEMENTING THE INVENTION

Principle

Figure 6A:
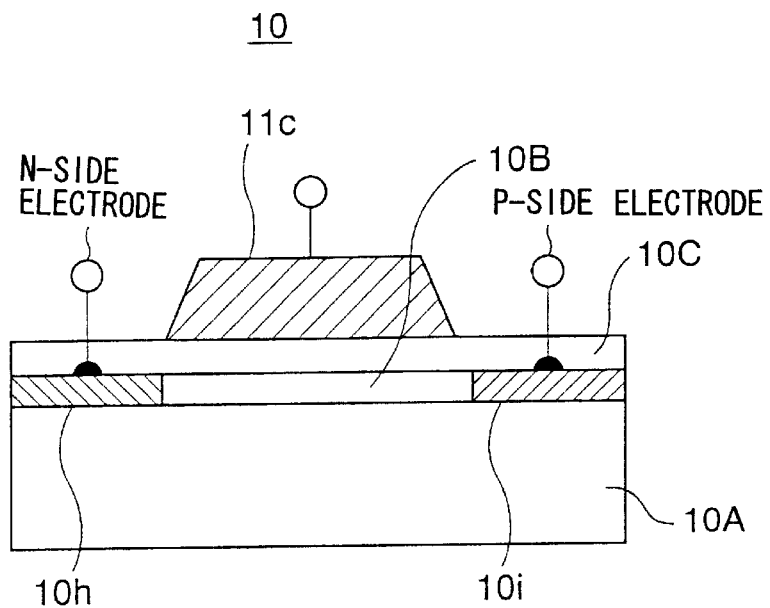
FIGS. 6A and 6B are diagrams explaining the principle of the present invention.
Figure 6B:
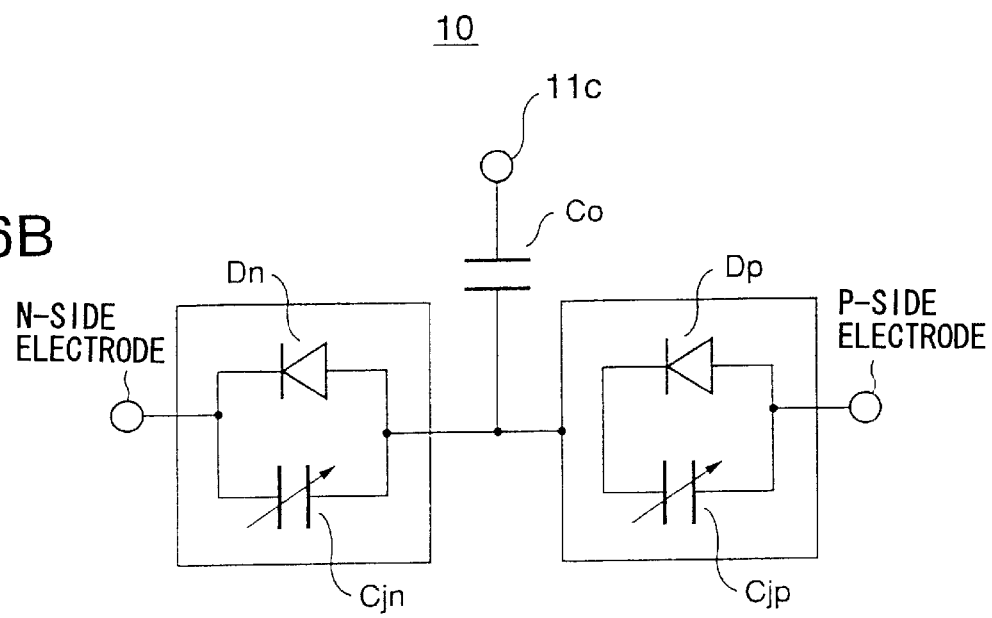

FIG. 6A is a diagram showing the principle of the MOS-type capacitance device according to the present invention, while FIG. 6B shows an equivalent circuit diagram thereof. In the drawings, those parts corresponding to the parts explained previously are designated by the same reference numerals and the description thereof will be omitted.

Referring to FIG. 6A, it can be seen in the MOS-type capacitance device that a diffusion region 10h of n$^+$-type is formed in the semiconductor layer 10B in correspondence to a first edge of the capacitor electrode 11c and a diffusion region 10i of p$^+$-type is formed in the semiconductor layer 10B in correspondence to another edge of the gate electrode 11c.

FIG. 6B shows the equivalent circuit diagram of the MOS-type capacitance device of FIG. 6A.

Referring to FIG. 6B, the MOS-type capacitance device includes a capacitance Co corresponding to the capacitance of the oxide film 10C connected to the gate electrode 11c and diodes D$_n$ and D$p$ respectively correspond to the diffusion region 10h and the diffusion region 10i. Further, junction capacitance C$_{jn}$ and C$_{jp}$ respectively corresponding to the diffusion regions 10h and 10i are included in the MOS-type capacitance device.

Figure 7A:
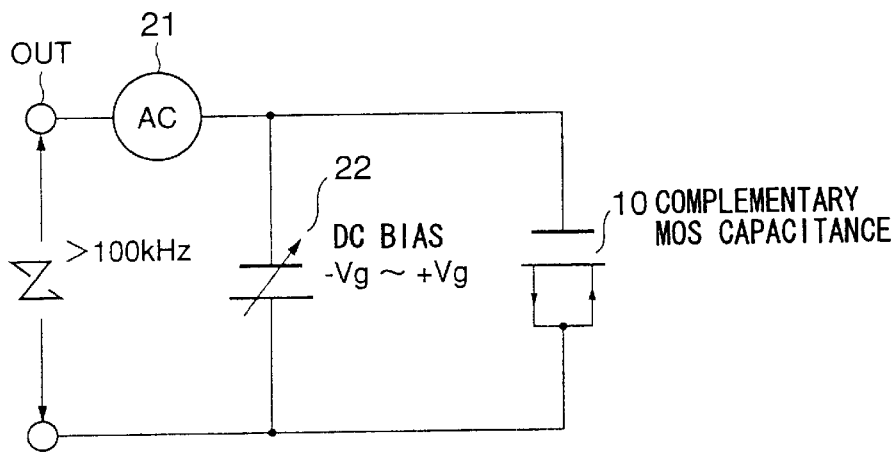
FIGS. 7A and 7B are other diagrams explaining the principle of the present invention.
Figure 7B:
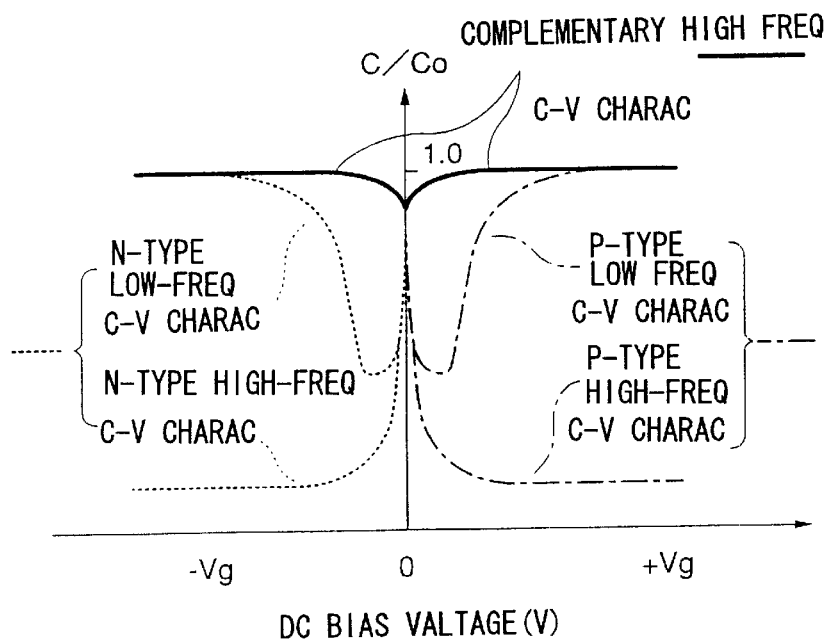

FIGS. 7A and 7B show the capacitance-voltage characteristic (C-Vg characteristic) of the MOS-type capacitance device 10 of FIGS. 6A and 6B respectively for the case in which a positive and negative d.c. bias voltages ±Vg are applied. It should be noted that FIG. 7A shows the construction for measuring the capacitance, wherein the capacitance value of the MOS-type capacitance device is obtained by measuring an impedance Z across output terminals OUT. FIG. 7B shows the capacitance-voltage characteristic thus obtained.

Referring to FIG. 7A, a complementary MOS-type capacitance device 10 is formed from the MOS-type capacitance device 10 of FIGS. 6A and 6B, by using the capacitor electrode 11c as a first terminal and forming a second terminal by commonly connecting the n$^+$-type diffusion region 10h and the p$^+$-type diffusion region 10i. The value of the capacitance C is then obtained by measuring the impedance Z at the foregoing output terminals OUT while applying a minute a.c. signal higher than 100 kHz in frequency from an a.c. signal source and simultaneously applying a positive or negative d.c. bias voltage ±Vg across the first and second terminals from a d.c. source 22.

FIG. 7B shows the capacitance of the MOS-type capacitance device 10 obtained from the test as a function of the d.c. bias voltage ±Vg. In FIG. 7B, it should be noted that the vertical axis represents a normalized capacitance value C/Co of the obtained capacitance value C normalized by the capacitance value Co of the oxide film 10C. The horizontal axis, on the other hand, shows the d.c. bias voltage ±Vg. Referring to the C-Vg characteristic of FIG. 7B, the broken line represents the case in which the capacitance between the capacitor electrode 11c and the n$^+$-type diffusion region 10h is obtained in the MOS-type capacitance device 10 without using the complementary construction of FIG. 7A, while the one-dotted line represents the case in which the capacitance between the capacitor electrode 11c and the p$^+$-type diffusion region 10i is obtained without using the foregoing complementary construction. As represented by the broken line, the capacitance between the capacitor electrode 11c and the n$^+$-type diffusion region 10h takes a value comparable to the capacitance value Co during the interval in which a positive voltage ±Vg is applied to the capacitor electrode 11c, due to the formation of an electron accumulation layer on the surface of the semiconductor layer 10B right underneath the electrode 11c in continuation to the n$^+$-type diffusion region 10h. On the other hand, in the case a negative voltage −Vg is applied to the capacitor electrode 11c, no such electron accumulation layer is formed and the capacitance value becomes very small. Similarly, as represented by the one-dotted line, the capacitance between the capacitor electrode 11c and the p$^+$-type diffusion region 10i takes a value comparable to the capacitance value Co during the interval in which the negative voltage −Vg is applied to the capacitor electrode 11c, due to the formation of a hole accumulation layer on the surface of the semiconductor layer 10B right underneath the electrode 11c in continuation to the p$^+$-type diffusion region 10i. On the other hand, in the case the positive voltage +Vg is applied to the capacitor electrode 11c, no such a hole accumulation layer is formed and the capacitance becomes very small. Further, in the case the complementary construction is not used, the C-Vg characteristic changed depending on the frequency as represented in FIG. 7B. In FIG. 7B, "Low-frequency C-V Characteristic" designates a C-Vg characteristic for a low frequency range, while "High-frequency C-V Characteristic" designates a C-Vg characteristic for a high-frequency range.

In the case the complementary construction shown in FIG. 7A is used, on the other hand, a C-Vg characteristic represented in FIG. 7B by a continuous line is obtained. Thus, the MOS-type capacitance device 10 having such a complementary construction shows a generally constant capacitance value irrespective of whether the applied d.c. bias voltage is positive or the applied d.c. bias voltage is negative. Further, the C-Vg characteristic of the MOS-type capacitance device 10 does not substantially depend on the frequency when the MOS-type capacitance device 10 has the complementary construction. This is because there occurs no formation of depletion layer in the semiconductor layer 11B right underneath the capacitor electrode 11c, irrespective of whether the polarity of the voltage applied to the capacitor electrode 11c is positive or negative and an electron accumulation layer or hole accumulation layer is formed continuously to the n$^+$-type diffusion region 11h or p$^+$-type diffusion region. In such a carrier accumulation layer, it should be noted that the carriers inducted on the surface of the semiconductor layer 11B can follow the voltage applied to the capacitor electrode 11c with high response speed.

Thus, the MOS-type capacitance device 10 having the device of FIGS. 6A and 6B in a complementary connection as represented in FIG. 7A shows a generally the same capacitance value to both of positive and negative voltages.

FIGS. 8A and 8B show the capacitance characteristic of the MOS-type capacitance device 10 for the case in which a symmetric high-frequency a.c. signal, such as the one used when driving a liquid crystal display device, is applied while eliminating the d.c. bias source 22 from the test apparatus of FIG. 7A. FIG. 8A shows the waveform of the high-frequency a.c. signal, while FIG. 8B shows the capacitance of the MOS-type capacitance device 10 corresponding to the waveform of FIG. 8A.

Referring to FIG. 8A, the driving signal used in a liquid crystal display device is a symmetric rectangular wave signal having an amplitude between a minimum level $V_{min}$ and a maximum level $V_{max}$. In the case the complementary connection is used, it can be seen from FIG. 8B that the MOS-type capacitance device of FIGS. 6A and 6B shows a generally constant capacitance irrespective of the polarity or amplitude of the driving signal. In FIG. 8B, it should be noted that the vertical axis represents a normalized capacitance C/Co normalized by the capacitance Co of the insulating film 10C, while the horizontal axis represents the voltage applied to the capacitor electrode 11c by the signal of FIG. 8A.

Figure 4:
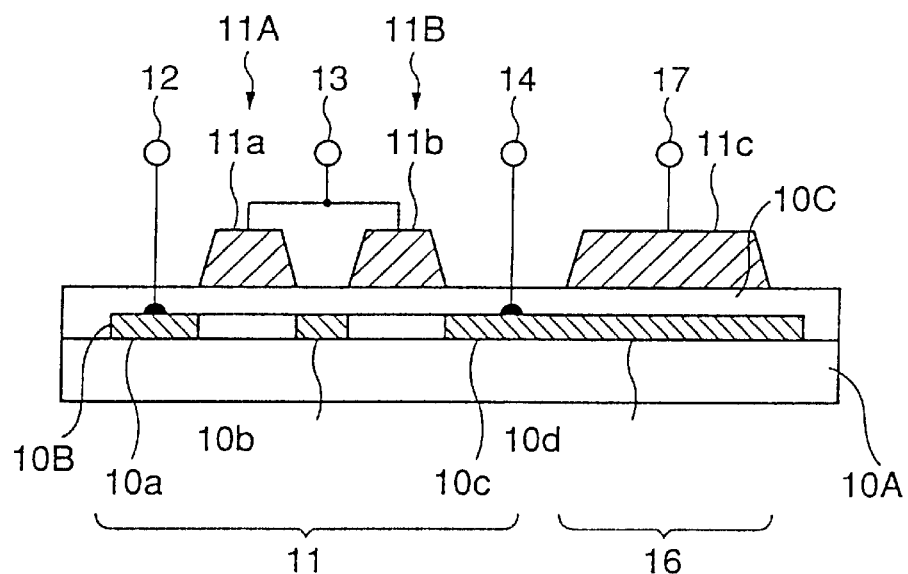
FIG. 4 is a cross-sectional diagram showing the construction of the conventional liquid crystal cell driving circuit.

Thus, by using the complementary connection as represented in FIG. 7A, the MOS-type capacitance device of the present invention shown in FIGS. 6A and 6B shows a substantially constant capacitance to any of positive and negative voltages of any of low-frequency signal and high-frequency signal and performs as an effective capacitor. The MOS-type capacitor of the present invention can be formed simultaneously to the fabrication process of other MOS transistors without adding a fabrication step, and the manufacturing cost of the electronic apparatus using such a MOS-type capacitance device, such as a liquid crystal display device, is reduced. In the MOS-type capacitance device of the present embodiment, the n$^+$-type diffusion region 11h and the p$^+$-type diffusion region 11i are formed by conducting an ion implantation process after the semiconductor layer 10B is covered with the insulating film 10C. Thereby, the problem of contamination of the semiconductor layer 10B by the impurity element as in the case of the conventional example of FIG. 4 does not occur. Associated with this, the problem of variation of the threshold voltage or other operational characteristics of the MOS transistors formed on the semiconductor layer 10B simultaneously to the MOS-type capacitance device, caused as a result of contamination by the impurity element, is eliminated. In the case the MOS-type capacitance device of the present invention is used for driving a liquid crystal display device, it is sufficient to maintain the capacitance electrode at the common voltage level and the stress applied to the insulating film 10C or other interlayer insulation film is reduced. Associated with this, the degradation of representation caused by such stress is avoided.

FIRST EMBODIMENT

FIGS. 9A–9E show the fabrication process of a MOS-type capacitance device 30 according to a first embodiment of the present invention.

Figure 9A:
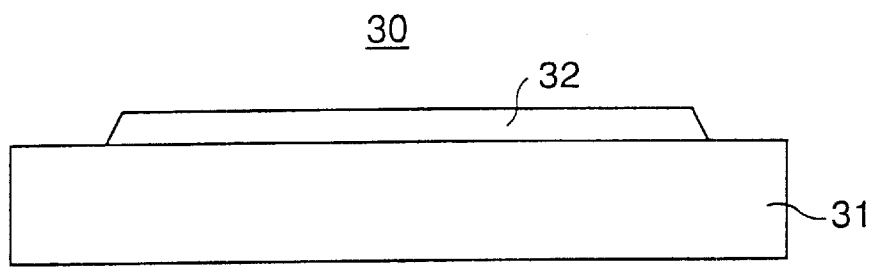
FIGS. 9A–9E are diagrams showing a fabrication process of a MOS-type capacitance device according to a first embodiment of the present invention.
Figure 9B:
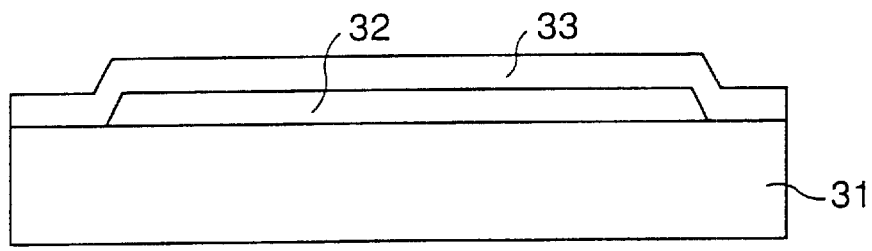

Referring to FIG. 9A, a semiconductor pattern of polysilicon or amorphous silicon is formed on a substrate 31 and a dielectric film 33 of $SiO_2$, and the like, is formed on the substrate 31 in the step of FIG. 9B so as to cover the semiconductor pattern 32. The substrate 31 may be a glass substrate of a liquid crystal display device or an insulating substrate for other purpose. The substrate 31 may be a single crystal Si substrate. Further, the semiconductor pattern 3 may be a single crystal Si pattern.

Figure 9C:
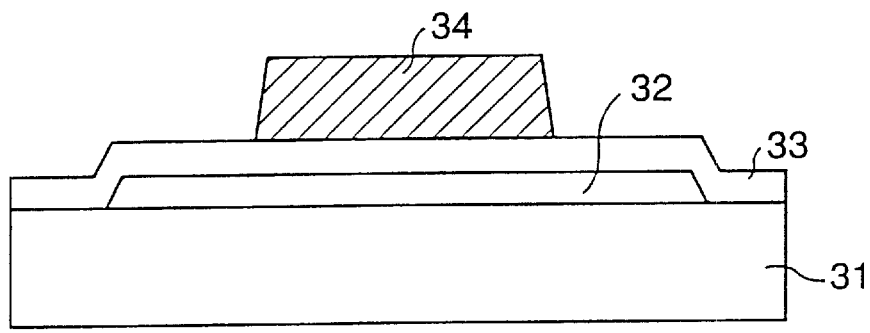

Next, in the step of FIG. 9C, a conductive film of Al or conductive polysilicon is deposited on the dielectric film 33 in the step of FIG. 9C, and a capacitor electrode 34 is formed by patterning the conductive film. Further, in the step of FIG. 9D, an n-type impurity element such as As$^+$ or P$^+$ is introduced into the semiconductor pattern 32 through the dielectric film 33 while using the capacitor electrode 34 as a self-aligned mask. By applying a thermal annealing process thereafter, a diffusion region 32 of n$^+$-type is formed at a first side of the capacitor electrode 34. During the ion implantation process of the foregoing n-type impurity element, the part of the semiconductor pattern 32 located at the other side of the capacitor electrode 34 is covered by a resist mask.

Figure 9D:
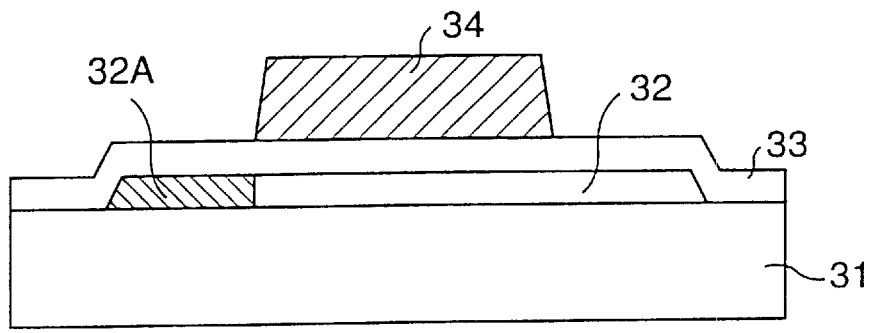
Figure 9E:
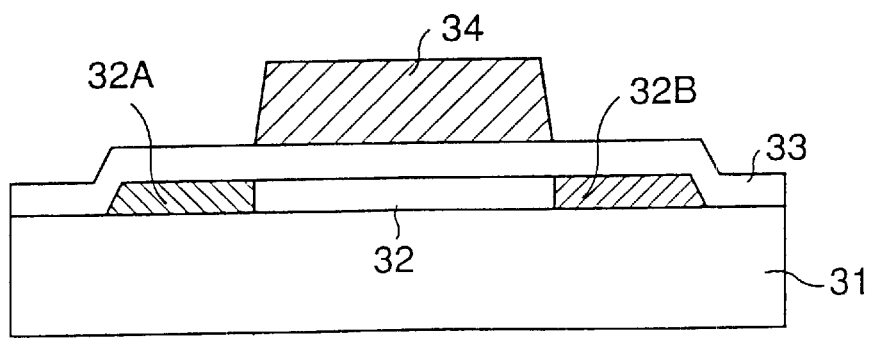

Next, in the step of FIG. 9E, the resist mask is removed and the part of the semiconductor pattern 32 located at the first side of the capacitor electrode 34 is covered by another resist mask. By introducing a p-type impurity element such as BF$^+$ into the semiconductor pattern 32 through the dielectric film 33, followed by a thermal annealing process, a diffusion region 32B of p$^+$-type is formed at the other side of the capacitor electrode 34.

In the fabrication process of the MOS-type capacitance device 30 according to the present embodiment, the ion implantation process is conducted in the step (FIG. 9D) and in the step (FIG. 9E) after the semiconductor pattern 32 is covered by the dielectric film 33. Thereby, the problem of the surface of the semiconductor pattern 32 being contaminated by the impurity element is avoided. Particularly, it should be noted that the process of FIGS. 9A–9E is completely compatible with the fabrication process of the top-gate type TFT used in liquid crystal display devices. Thus, according to the present embodiment, it is possible to form other MOS transistors on the semiconductor pattern 32 simultaneously to the formation of the MOS-type capacitance device 30.

In the case of forming a top-gate type n-channel TFT adjacent to the MOS-type capacitance device 30, it is possible to form a gate electrode in the step of FIG. 9C on the semiconductor pattern 32 or on a similar semiconductor pattern simultaneously to the capacitor electrode 34 and form a source region and a drain region of n$^+$-type at both sides of the gate electrode in the step of FIG. 9D simultaneously to the formation of the diffusion region 34. In the case the TFT to be formed is a p-channel TFT, source and drain regions of p$^+$-type are formed at both sides of the gate electrode in the step of FIG. 9E, simultaneously to the diffusion region 32B.

The MOS-type capacitance device 30 thus formed has a desirable capacitance characteristic explained previously with reference to FIG. 7B or FIG. 8B.

Figure 10A:
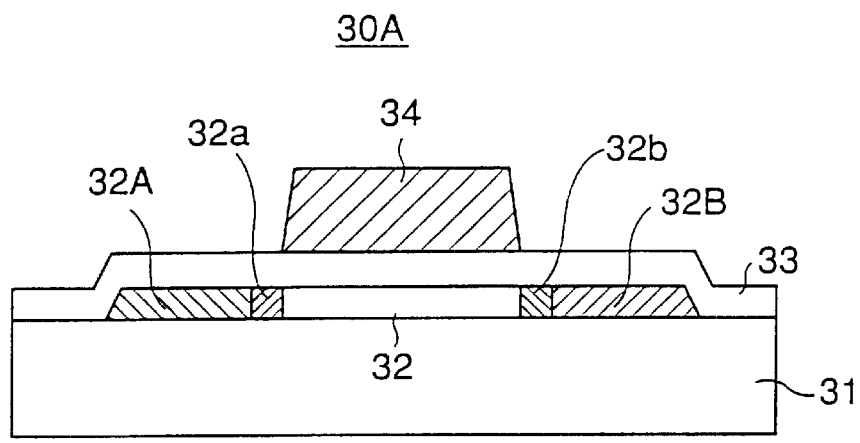
FIGS. 10A–10C are diagrams showing various modifications of the MOS-type capacitance device according to the first embodiment of the present invention.

FIG. 10A shows a MOS-type capacitance device 30A according to a modification of the MOS-type capacitance device 30 of FIG. 9E.

Referring to FIG. 10A, the n$^+$-type diffusion region 32A is formed in the semiconductor pattern 32 with a separation from the capacitor electrode 34 in the case of the MOS-type capacitance device 30A, and an LDD region 32a of n⁻-type is formed therebetween. Similarly, the p⁺-type diffusion region 32B is formed with a separation from the capacitor electrode 34, and an LDD region 32b of p⁻-type is formed therebetween. The formation of the LDD region 32a or 32b is achieved by forming a side wall insulation film on the capacitor electrode 34. Alternatively, a separate mask process may be used. By forming the LDD regions 32a or 32b, it is possible to increase the breakdown voltage of the MOS-type capacitance device 30A.

Figure 10B:
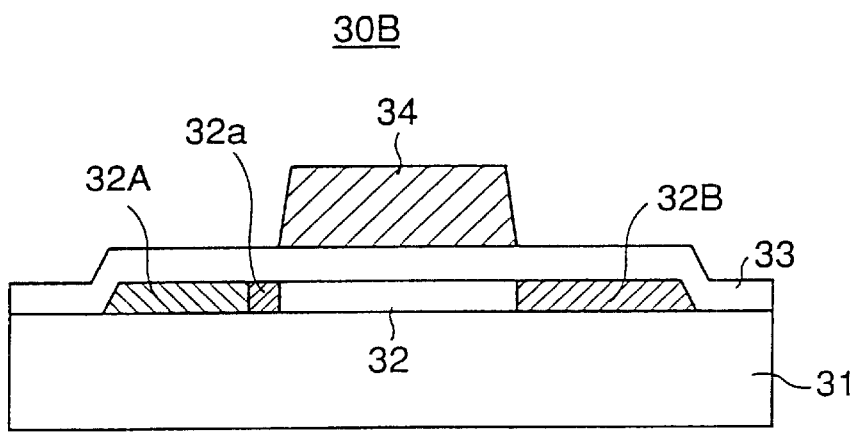

FIG. 10B shows a MOS-type capacitance device 30B according to a modification of the MOS-type capacitance device 30A of FIG. 10A.

Referring to FIG. 10B, a part of the LDD region of the MOS-type capacitance device 30A of FIG. 10A, such as the LDD region 32b, is omitted in the MOS-type capacitance device 30B. In such a construction, too, it is possible to increase the MOS-type capacitance device.

Figure 10C:
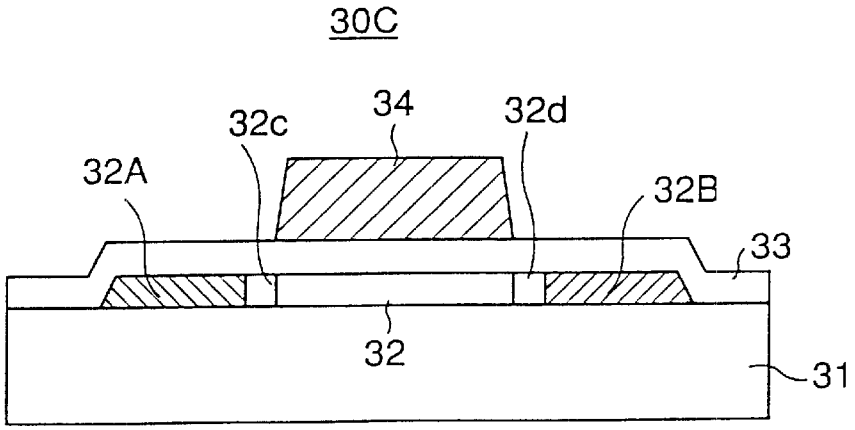

FIG. 10C shows a MOS-type capacitance device 30C according to a further modification of the MOS-type capacitor 30A of FIG. 10A.

Referring to FIG. 10C, the n⁺-type diffusion region 32A is formed in the semiconductor pattern 32 with a separation form the capacitor electrode 34 and there is formed an offset region 32c therebetween. Similarly, the p⁺-type diffusion region 32B is formed with a separation from the capacitor electrode 34 and an offset region 32d is formed therebetween. By forming the offset region 32c or 32d as such, it is possible to increase the breakdown voltage of the MOS-type capacitance device 30C.

Figure 11:
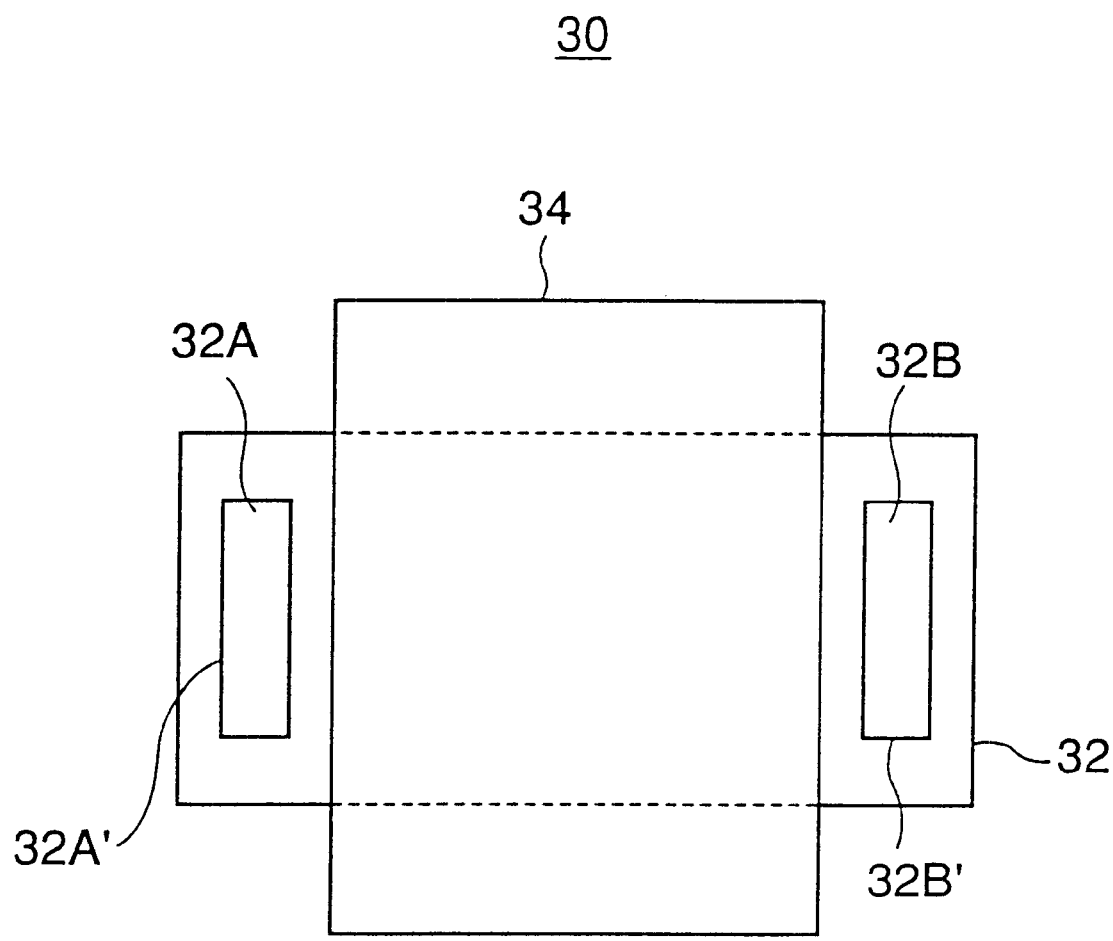
FIG. 11 is a plan-view diagram showing the MOS-type capacitance device according to the first embodiment of the present invention.

FIG. 11 shows the MOS-type capacitance device 30 of FIG. 9E in a plan view.

Referring to FIG. 11, it can be seen that the capacitor electrode 34 covers a central part of the semiconductor pattern 32 and the part of the semiconductor pattern 32 exposed at the first side of the capacitor electrode 34 is doped to n⁺-type and forms the diffusion region 32A. Further, the part exposed at the other side is doped to p⁺-type and forms the diffusion region 32B. Further, an ohmic contact 32A' is formed in the n⁺-type diffusion region 32A, and an ohmic contact 32B' is formed in the p⁺-type diffusion region 32B.

Figure 12A:
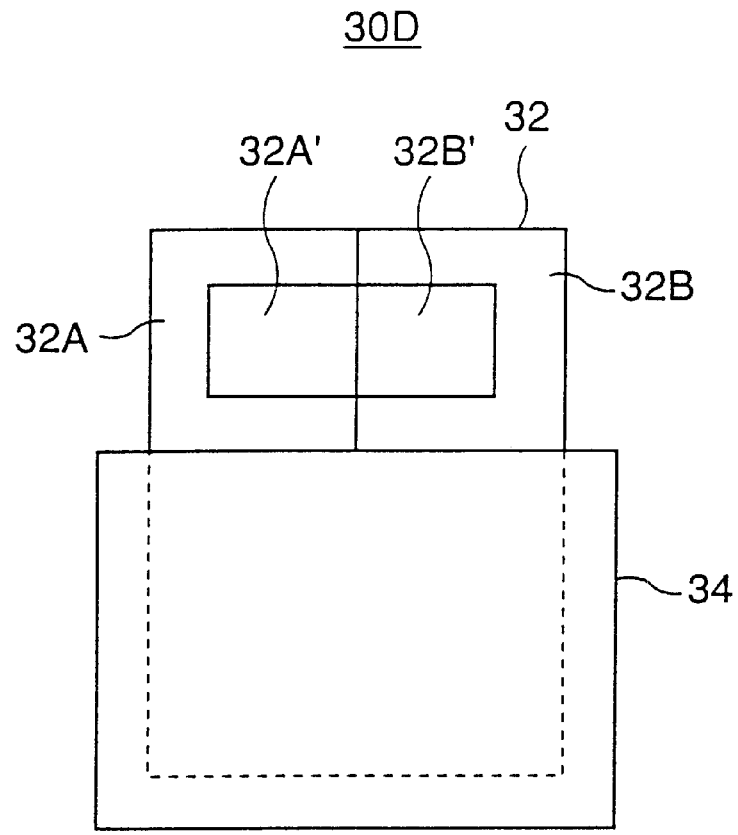
FIGS. 12A and 12B are diagrams showing various modifications of the MOS-type capacitance device of FIG. 11.

FIG. 12A shows a MOS-type capacitance device 30D according to a modification of the MOS-type capacitance device 30 of FIG. 11 in a plan view.

Referring to FIG. 12A, the semiconductor pattern 32 is exposed only at the first side of the capacitor electrode 34 and the n⁺-type diffusion region 32A and the p⁺-type diffusion region 32B are formed in the foregoing exposed part adjacent with each other. In such a construction, the ohmic contacts 32A' and 32B' can be formed respectively on the diffusion regions 32A and 32B in the form of a single continuous ohmic contact. Thereby, the complementary connection of the n⁺-type diffusion region 32A and the p⁺-type diffusion region 32B can be formed easily.

Figure 12B:
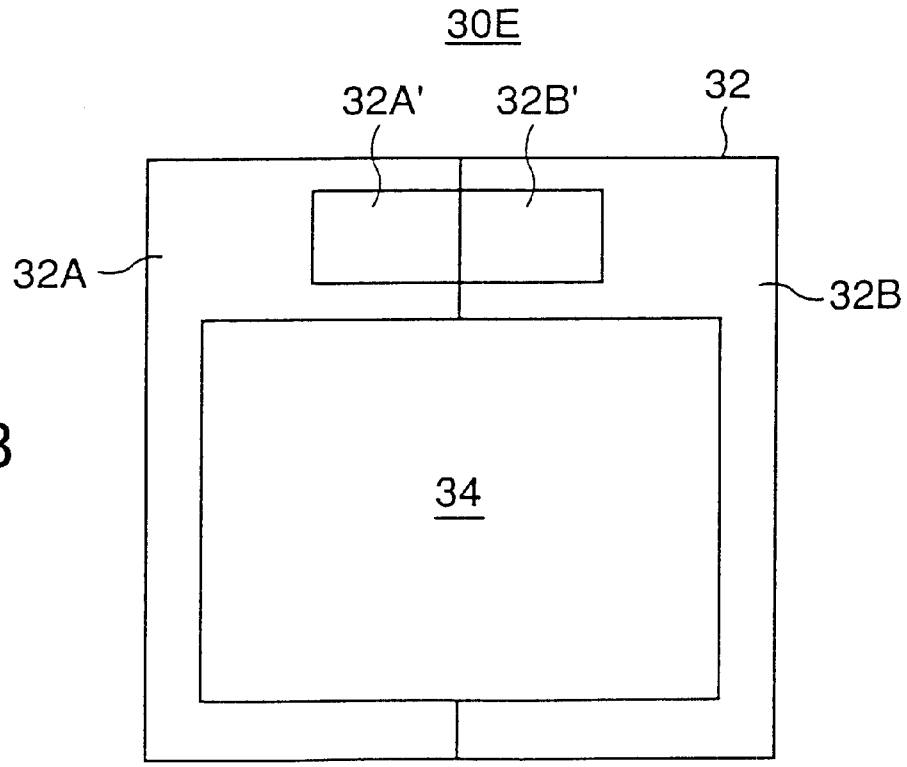

FIG. 12B shows the construction of a MOS-type capacitance device 30E according to a modification of the MOS-type capacitance device 30D of FIG. 12A in a plan view.

Referring to FIG. 12B, the capacitor electrode 34 is included in the semiconductor pattern in the plan view, and a first exposed part of the semiconductor pattern 32 is doped to n⁺-type and forms the diffusion region 32A. On the other hand, the other exposed part of the semiconductor pattern 32 is doped to p⁺-type and forms the diffusion region 32B. Similarly to the embodiment of FIG. 12A, the ohmic contact 32A' of the diffusion region 32A and the ohmic contact 32B' of the diffusion region 32B are formed in continuation with each other and a single ohmic contact is formed. With this, the present embodiment can realize a complementary connection connecting the n⁺-type diffusion region 32A and the p⁺-type diffusion region 32B easily.

SECOND EMBODIMENT

FIGS. 13A–13E show the fabrication process of a MOS-type capacitor 40 according to a second embodiment of the present invention wherein the process of the present embodiment is compatible with the fabrication process of a TFT of the bottom gate construction.

Referring to FIG. 13A, a capacitor electrode pattern 42 of conductive amorphous silicon and the like, is formed on an insulating substrate 41 such as a glass substrate. Next, in the step of FIG. 13B, a dielectric film 43 of an SiO₂ film or the like is formed on the insulating substrate 41 so as to cover the capacitor electrode pattern 42. In the step of FIG. 13B, an amorphous silicon film 44 is deposited further on the dielectric film 43.

Next, in the step of FIG. 13C, the amorphous silicon film 44 is patterned to form a semiconductor pattern 44P, and an ion implantation process of As⁺ or P+is conducted into a part of the semiconductor pattern 44P located at a first side of the capacitor electrode pattern 42. As a result, a diffusion region 44A of n⁺-type is formed.

Further, in the step of FIG. 13E, a part of the semiconductor pattern 44P located at the other side of the capacitor electrode pattern 42 is subjected to an ion implantation process of BF⁺ and a p⁺-type diffusion region 44B is formed. The ion implantation process of FIGS. 13D and 13E may be conducted after covering the semiconductor pattern 44P by an insulating film such that the ion implantation process is made through the insulating film.

The MOS-type capacitance device 40 of the present embodiment can be formed simultaneously with bottom-gate-type TFTs in an active matrix driven liquid crystal display device.

THIRD EMBODIMENT

Figure 3:
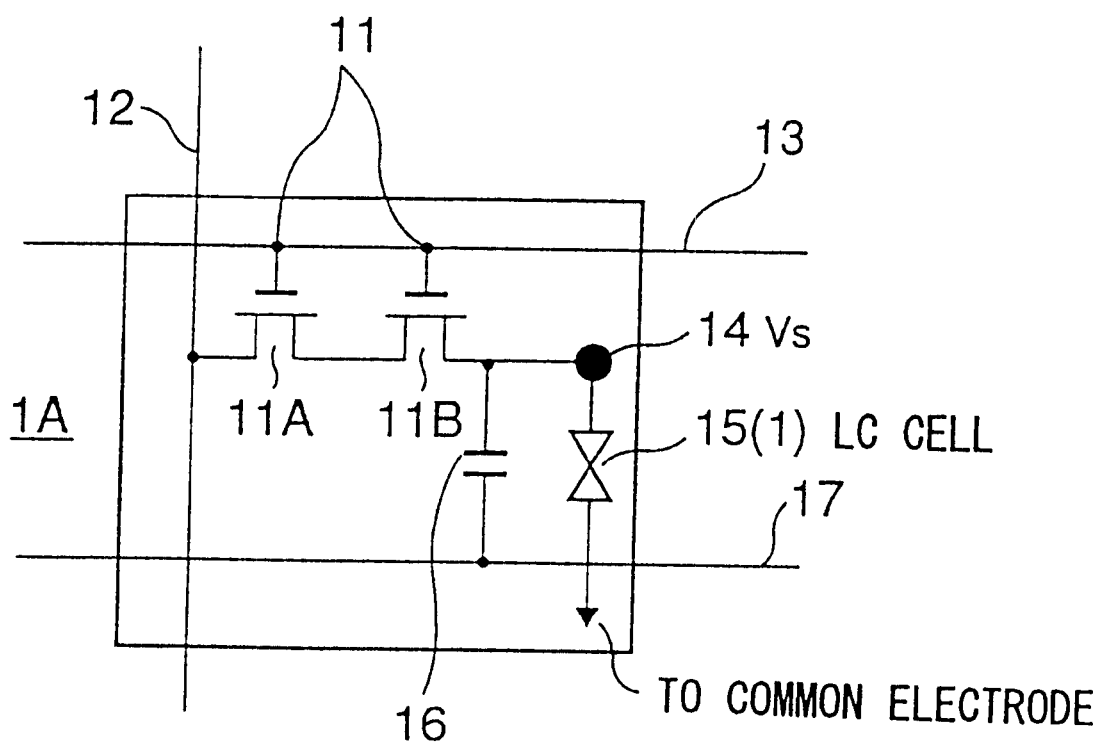
FIG. 3 is a circuit diagram showing a part of a liquid crystal cell driving circuit used in the liquid crystal display device of FIG. 1.
Figure 14A:
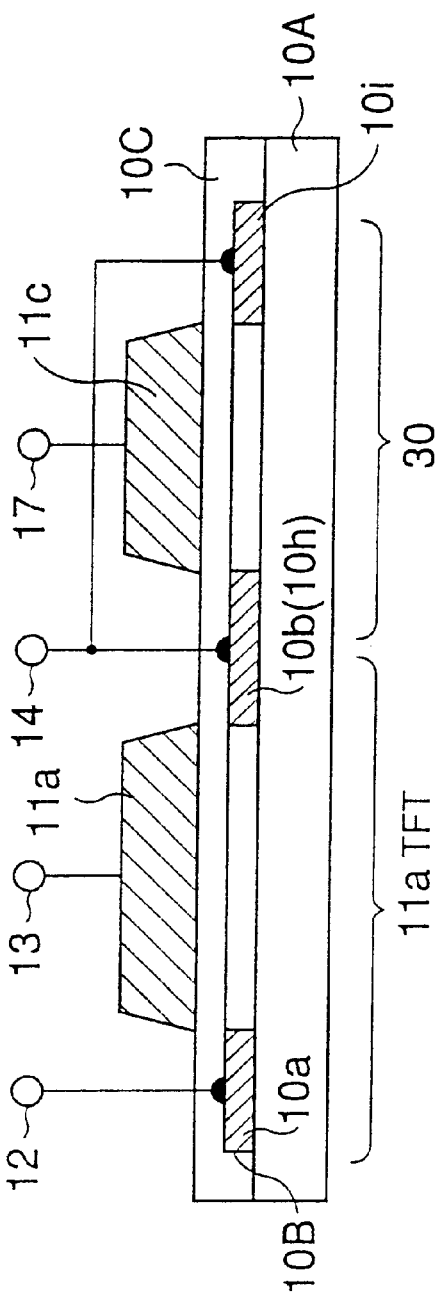
FIGS. 14A and 14B respectively are a cross-sectional diagram showing the construction of a liquid crystal cell driving circuit of an active-matrix driven liquid crystal display device according to a third embodiment of the present invention, and a diagram showing various signal waveforms applied to the foregoing liquid crystal cell driving circuit.
Figure 14B:
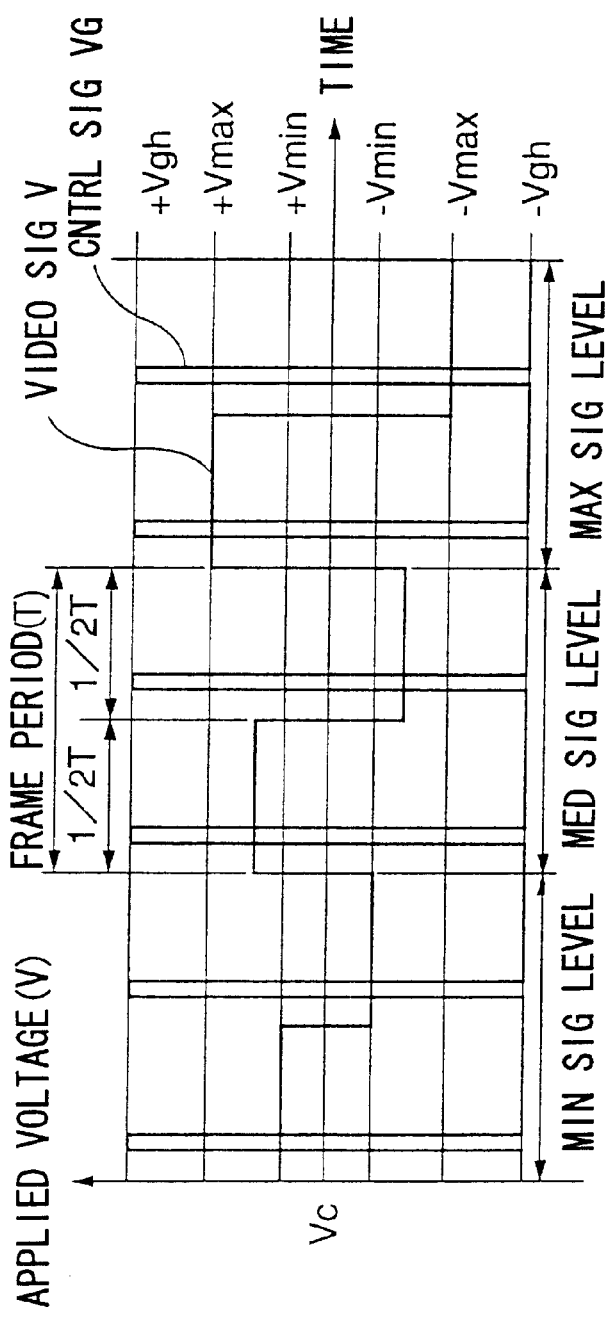

FIGS. 14A and 14B show an example of applying the MOS-type capacitance device 30 explained before to the liquid crystal cell driving circuit of an active-matrix-type liquid crystal display device of FIG. 3, as a driving circuit 50 according to a third embodiment of the present invention, wherein those parts of FIGS. 14A and 14B explained previously are designated by the same reference numerals and the description thereof will be omitted.

Figure 5:
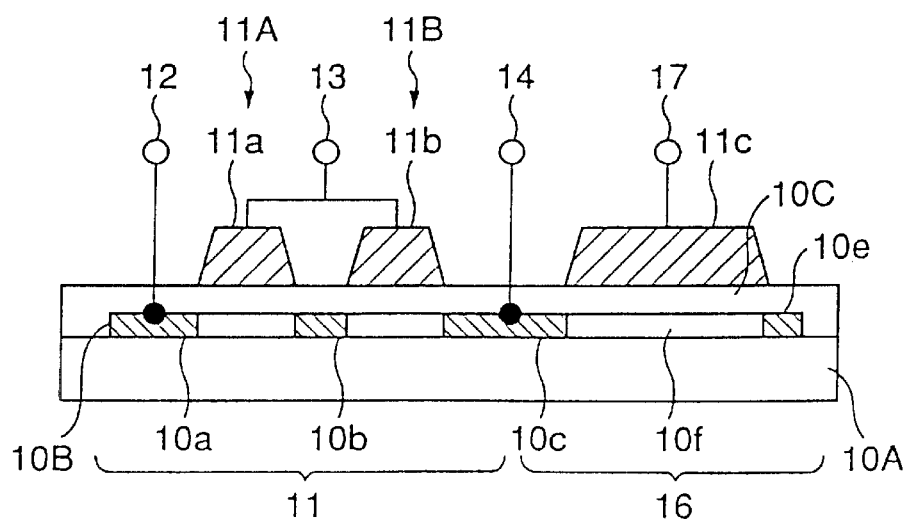
FIG. 5 is a cross-sectional diagram showing the construction of another conventional liquid crystal cell driving circuit.

Referring to FIG. 14A, the driving circuit 50 of the present embodiment includes the TFT 11a formed on the semiconductor layer 10B of polysilicon and the like and a the MOS-type capacitance device 30 formed on the semiconductor layer 10B adjacent to the TFT 11a. Similarly to the construction explained before with reference to FIG. 5, the TFT 11a includes the n⁺-type diffusion regions 10a and 10b formed in the semiconductor layer 10B, and the gate electrode 11a is formed on the insulating film 10C between the diffusion regions 10a and 10b. Thereby, the insulating film 10C constitutes a gate insulation film right underneath the gate electrode 11a.

On the other hand, the MOS-type capacitance device 30 has a construction shown in FIG. 6A or FIG. 9E and includes the diffusion region 10b in the semiconductor layer 10B as the n⁺-type diffusion region 10h of FIG. 6A or the diffusion region 32A of FIG. 9E and further the p⁺-type diffusion region 10i as the diffusion region 32A of FIG. 9E. Further, the capacitor electrode 11c is formed on the insulating film 10C between the diffusion regions 10b and 10i.

To the gate electrode 11a, a control signal VG shown in FIG. 14B is supplied via the signal line 13. Referring to FIG. 14B, the control signal VG has a level of −Vg1 in the ordinary state and causes a transition to the level of +Vg1 only when the TFT 11a is selected. Further, a video signal VS shown in FIG. 14B is supplied to the diffusion region 10a. The video signal is forwarded to the diffusion region 10b via the channel region of the TFT 11a and held in the MOS-type capacitance device 30. The video signal VS is a symmetric a.c. signal having a frame period T as represented in FIG. 14B and changes the value alternately between +Vmin and −Vmin in the interval of minimum signal level. Further, the video signal VS changes the value alternately between +Vmax and −Vmax in the interval of maximum signal level. Further, in the interval of intermediate signal level, the value of the signal changes alternately positive and negative with a level intermediate between Vmax and Vmin. Further, the capacitor electrode 11c is held at a common potential level (Vcom), which is applied to a transparent opposinit e4lectrode on the opposing substrate 1B (see FIG. 1). The capacitor electrode 11c is connected to the capacitance line 17 of FIG. 3, while in the present embodiment, the foregoing common potential level Vcom is supplied to the capacitance line.

Figure 2:
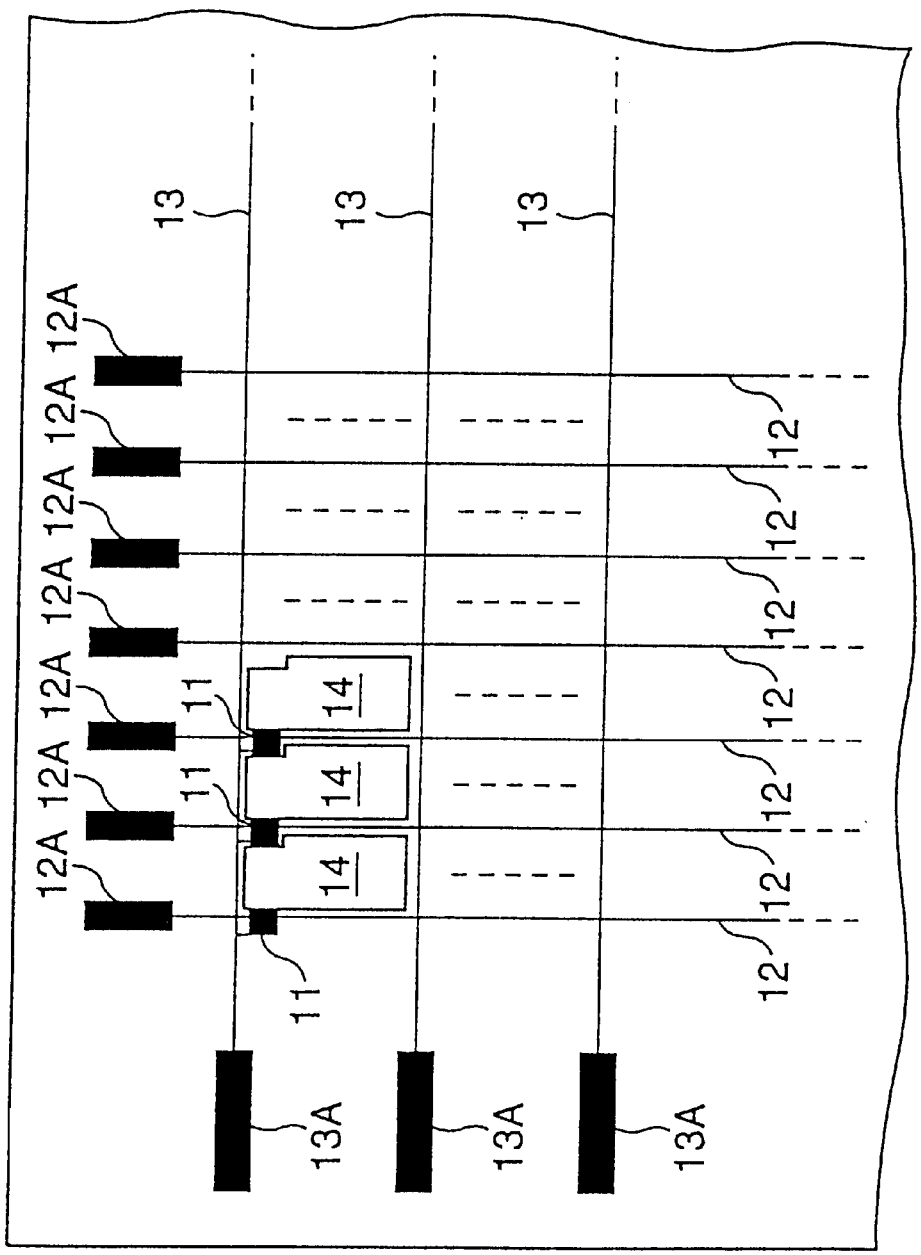
FIG. 2 is a diagram showing a part of the liquid crystal display device of FIG. 1 in an enlarged scale.

The video signal VS held in the MOS-type capacitance device 30 is applied to the liquid crystal cell 15 from the n⁺-type diffusion region 10b via the pixel electrode 14 (see FIG. 2).

In the present embodiment, the MOS-type capacitance device 30 has a characteristic explained previously with reference to FIG. 7B or FIG. 8B and holds the positive and negative video signals VS stably.

As explained before, the MOS-type capacitance device 30 is completely compatible with the fabrication process of the TFT 11a and thus can be formed simultaneously with the formation of the TFT 11a.

In an active matrix driven liquid crystal display device, the use of the MOS-type capacitance device 30 of the present invention in combination with the TFT 11a achieves a stabilization of voltage applied to the liquid crystal cell 15 and a high-quality and high-stability displaying becomes possible. Further, the present embodiment, which uses the same voltage supplied to the transparent opposing electrode for the voltage supplied to the capacitance line 17, can eliminate the use of a separate driving power source for driving the capacitance line 17.

FOURTH EMBODIMENT

Figure 15:
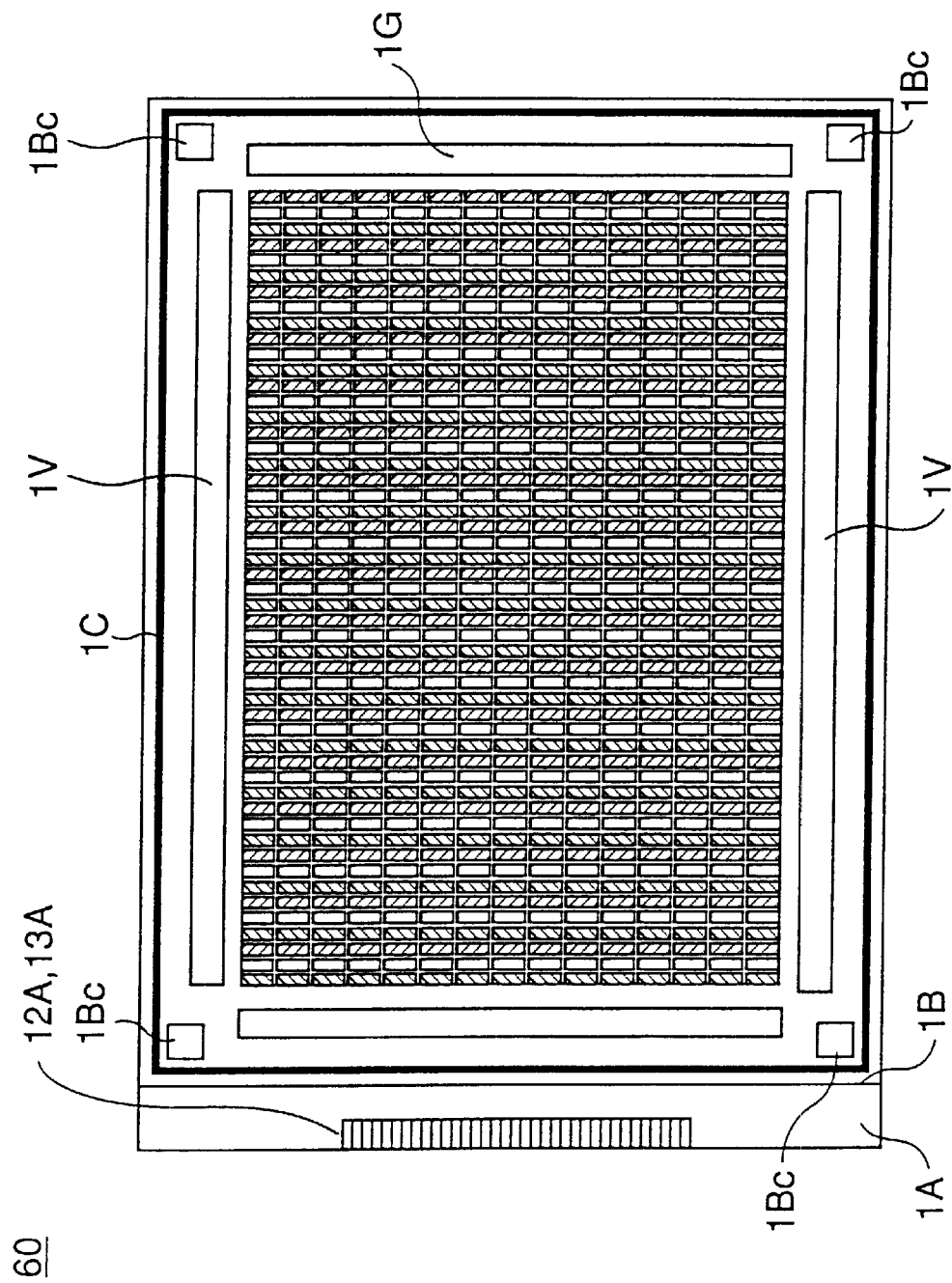
FIG. 15 is a diagram showing the construction of a liquid crystal panel used in a direct-view type liquid crystal display device according to a fourth embodiment of the present invention.

FIG. 15 shows the construction of a liquid crystal panel 60 of a direct view type liquid crystal display device that uses the liquid crystal cell driving circuit 50 of FIGS. 14A and 14B.

Referring to FIG. 15, the liquid crystal panel 60 is formed of the TFT substrate 1A and the opposing substrate 1B explained with reference to FIG. 1 and the liquid crystal layer 1 confined therebetween. On the TFT substrate 1A, the liquid crystal cell driving circuits 50 (not shown) of FIG. 14 are arranged in a row and column formation in correspondence to a row and column arrangement of the pixel electrodes 14 (see FIG. 2). Further, a gate-side peripheral circuit 1G for selecting a gate control line 13 and a signal-side peripheral circuit 1V for selecting a signal line 12 are formed on the TFT substrate 1A so as to surround the array of the pixel electrodes 14 and the liquid crystal cell driving circuits 50.

On the opposing surface of the opposing substrate 1B facing the substrate 1A, on the other hand, RGB tri-color filters are formed in a row and column formation in correspondence to each of the pixels, and the foregoing opposing surface is further covered uniformly by a transparent opposing electrode (not shown) such that the transparent opposing electrode covers the foregoing tri-color filters. To the foregoing transparent opposing electrode, the same common potential level Vcom supplied to the capacitor electrode 11c of the MOS-type capacitance device 30 is supplied at opposing electrode contacts 1Bc formed at four corners of the substrate 1B.

FIFTH EMBODIMENT

Figure 16:
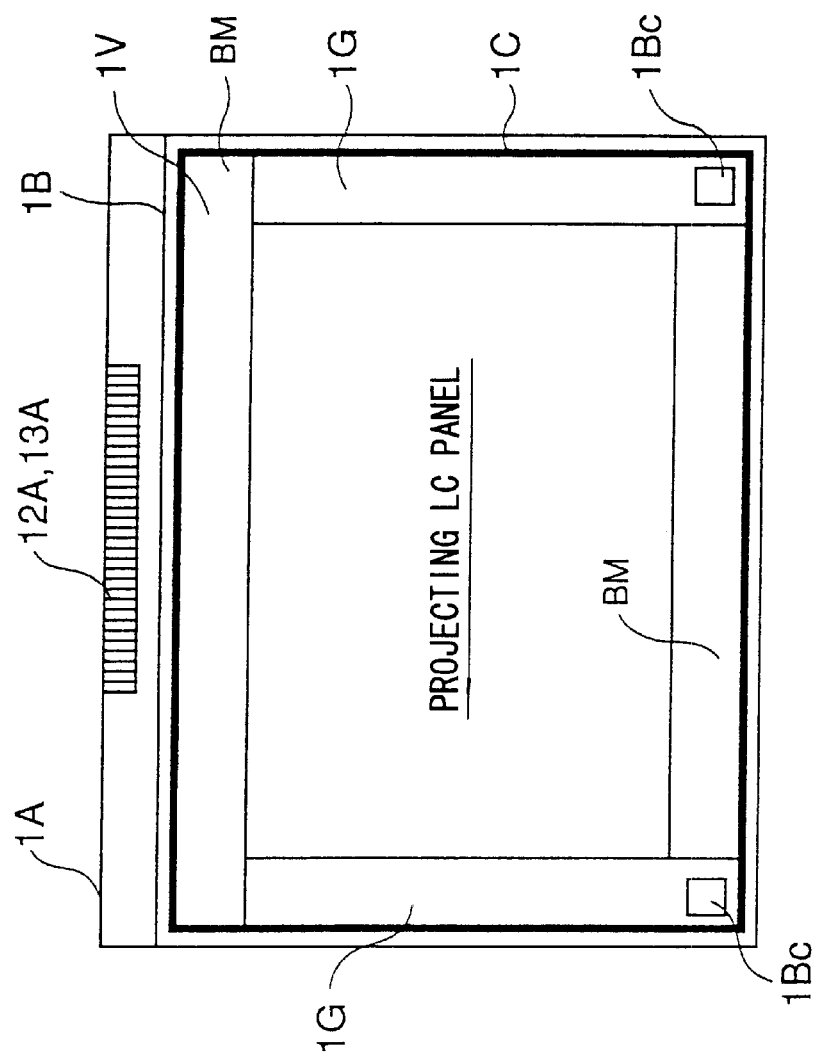
FIG. 16 is a diagram showing the construction of a liquid crystal panel used in a projection-type liquid crystal display device according to a fifth embodiment of the present invention.

FIG. 16 shows the construction of the liquid crystal panel 70 used for a projection-type liquid crystal display device that uses the liquid crystal cell driving circuit 50 of FIGS. 14A and 14B, wherein those parts explained previously are designated by the same reference numerals and the description thereof will be omitted.

Figure 1:
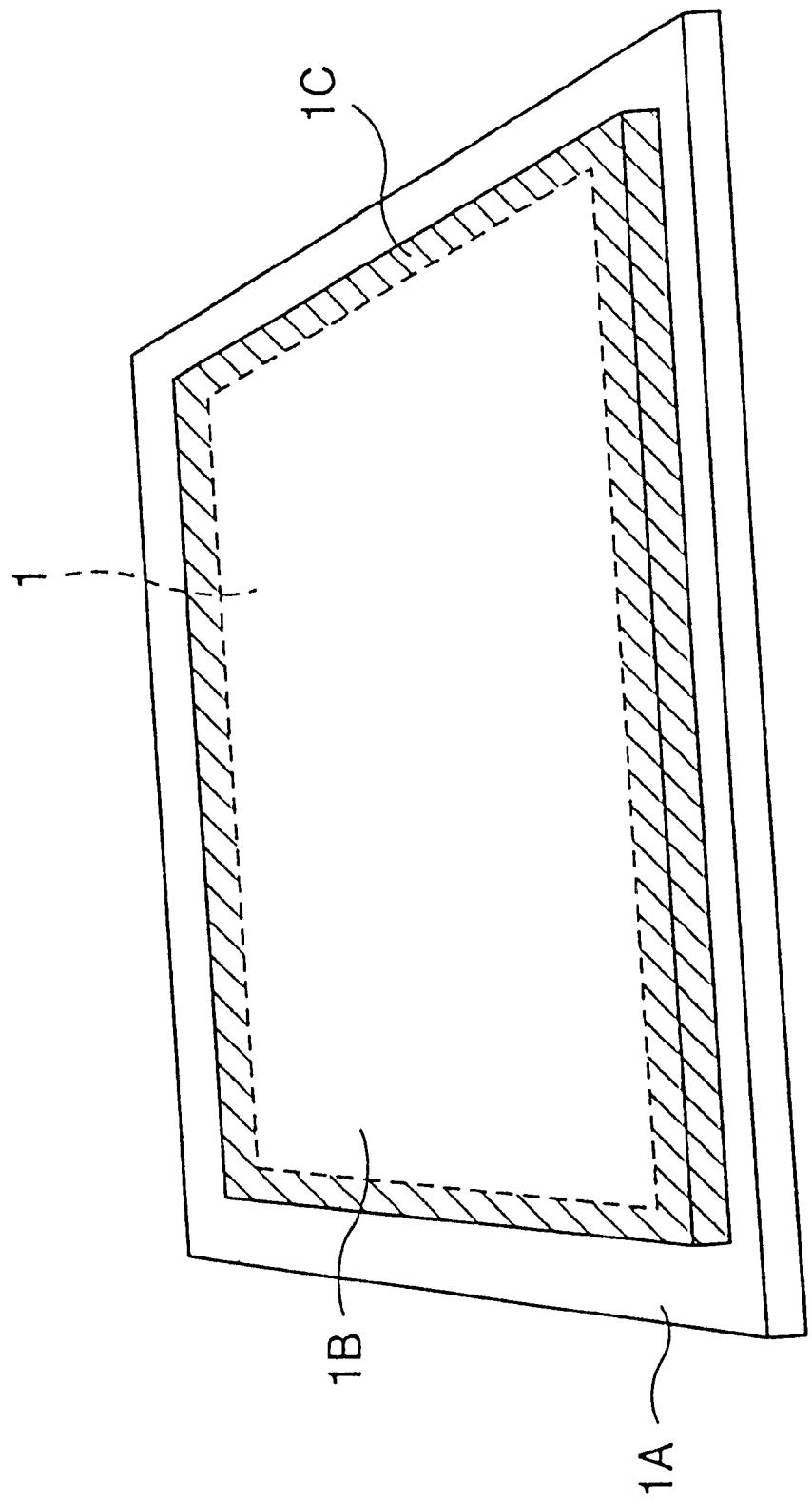
FIG. 1 is a schematic diagram showing a conventional liquid crystal display device.

Referring to FIG. 16, the liquid crystal panel 70 is formed of the TFT substrate 1A of FIG. 1, the opposing substrate 1B and the liquid crystal layer 1 confined therebetween, and the liquid cell driving circuits 50 of FIG. 14A are arranged on the TFT substrate 1A in a row and column formation in correspondence to the pixel electrodes 14 (see FIG. 2) arranged in row and column formation. Further, the gate-side peripheral circuit 1G selecting a gate electrode 13 and the signal-side peripheral circuit 1V selecting a signal line 12 are disposed on the TFT substrate 1A so as to surround the array of the pixel electrodes 14 and the liquid crystal cell driving circuits 50.

On the other hand, a transparent opposing electrode (not shown) is formed on the opposing surface of the opposing substrate 1B facing the substrate 1A uniformly. Further, the common electric potential level Vcom identical with the one supplied to the capacitor electrode 11c of the MOS-type capacitance device 30, is supplied to the foregoing transparent opposing electrode at the opposing electrode contacts 1Bc, similarly to the liquid crystal panel 70 of FIG. 15. Further, an opaque pattern BM is formed on the opposing substrate 1B so as to cover the circuits 1G or 1V on the TFT substrate 1A. A similar opaque patterns is formed, although not illustrated, also on each of the liquid crystal cell driving circuits 50 arranged in row and column formation.

Figure 17:
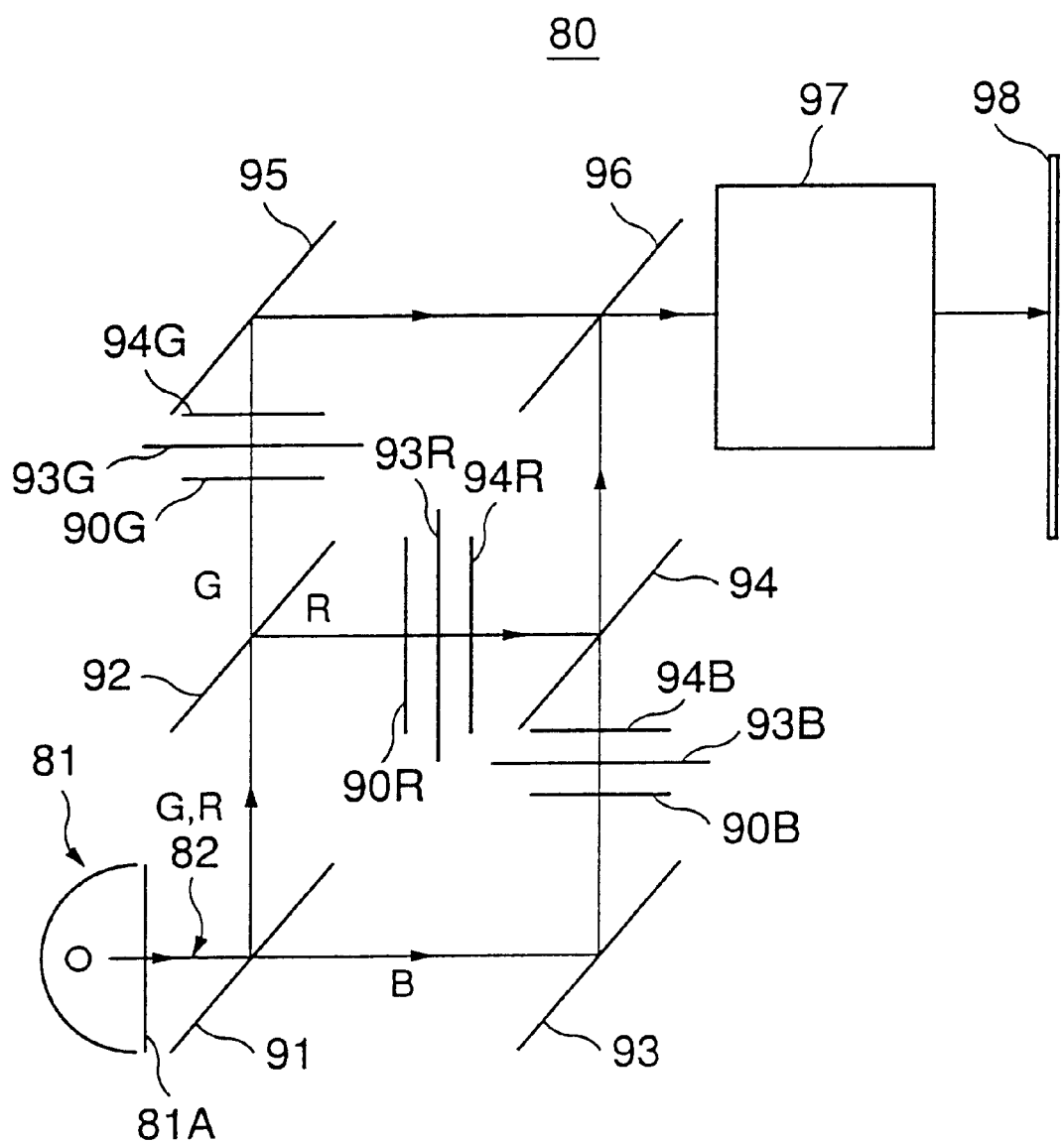
FIG. 17 is a diagram showing the construction of a projection-type liquid crystal display device using the liquid crystal panel of FIG. 16.

FIG. 17 shows the construction of a projection-type liquid crystal display device 80 that uses the liquid crystal panel 70 of FIG. 16.

Referring to FIG. 17, the projection type liquid crystal display device 80 includes a powerful optical source 81 of a metal halide lamp and the like, a dichroic mirror 91 disposed in an optical path of an optical beam 82 emitted from the optical source 81 through a ultra-violet cut filter 81A constituting a part of the optical source 80, the dichroic mirror allowing to pass a blue color component and reflecting other lights, a dichroic mirror disposed in an optical path of an optical beam reflected by the dichroic mirror 91, the dichroic mirror 92 reflecting a red color component and allowing to pass other lights, thus a green optical component, and a mirror 93 disposed in an optical path of a blue color beam passed through the dichroic mirror 91 for reflecting the same, and the blue color beam B passed through the dichroic mirror impinges upon a light valve 93B formed of the liquid crystal panel 70 of FIG. 16 after being reflected by the mirror 93 and passed through an incoming-side polarizing element 90B.

The blue color beam B passed through the liquid crystal panel 93B is then subjected to a spatial modulation by an exit-side polarizing element 93B disposed with a crossed Nicol state with respect to the incoming-side polarizing element 90B.

Similarly, the red optical beam separated by the dichroic mirror 22 is caused to pass an incoming-side polarizer 90R and experiences a spatial modulation by an exit-side polarizing element 94R after passed through a liquid crystal panel 93R. Further, the red optical beam spatially modulated by the output-side polarizing element 94R is added with the blue optical beam spatially modulated by the exit-side polarizing element 94B at a dichroic mirror 94 and enters another dichroic mirror 96.

Similarly, the red optical beam separated by the dichroic mirror 92 is caused to pass through an incoming-side polarizing element 90G and experiences a spatial modulation at an exit-side polarizing element 94G after passing through a liquid crystal panel 93G. The green optical beam thus spatially modulated at the exit-side polarizing element 94G then impinges upon said another dichroic mirror 96 by a mirror 95. Thereby, the blue optical beam and the red optical beam thus spatially modulated are added, and the optical beams thus added are projected on a screen 98 by a projecting optical system 97.

SIXTH EMBODIMENT

Figure 18:
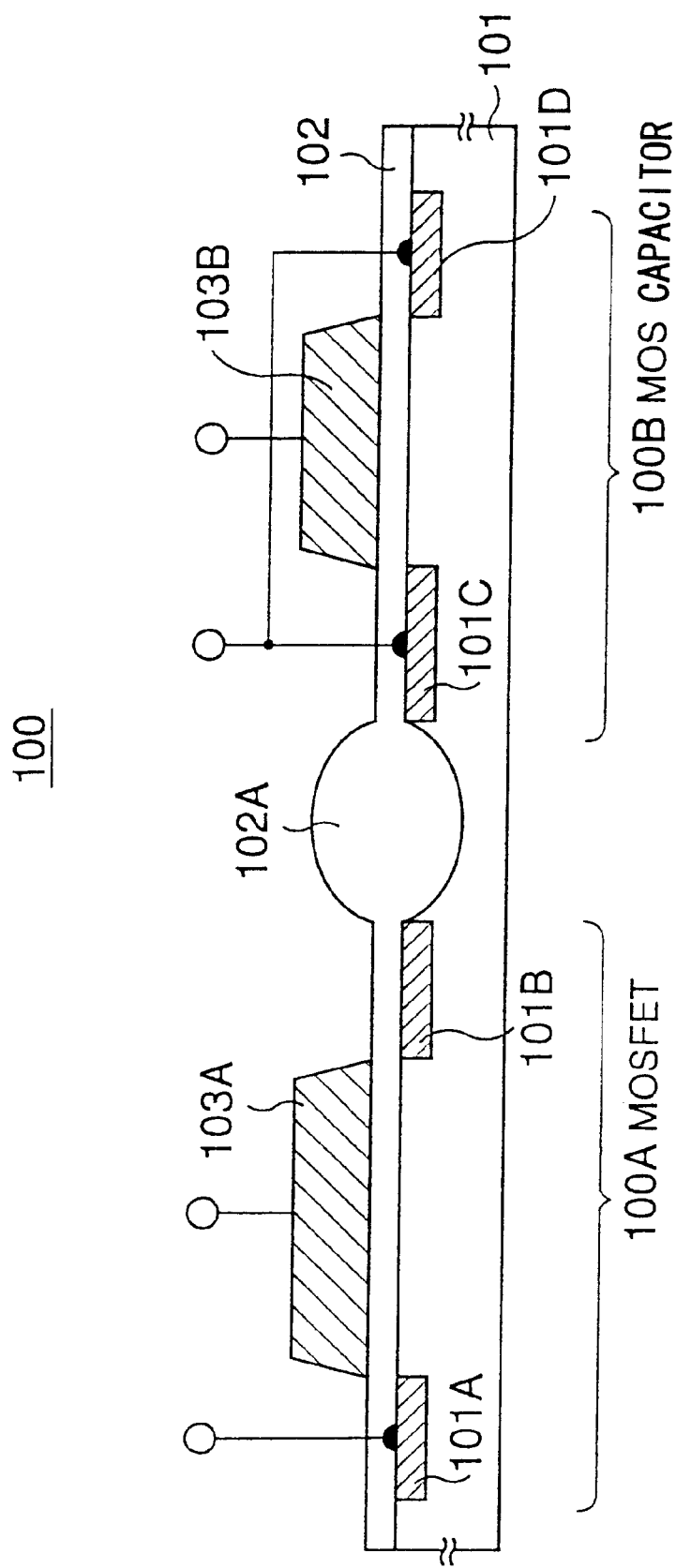
FIG. 18 is a diagram showing the construction of a semiconductor integrated circuit according to a sixth embodiment of the present invention.

FIG. 18 shows the construction of a semiconductor integrated circuit 100 that uses the MOS-type capacitance device 10 or 30 according to the present invention.

Referring to FIG. 18, the semiconductor integrated circuit 100 is formed on a p-type Si substrate 101 covered with a thermal oxide film 102 having a thickness of typically 10–0 nm. Further, a device isolation structure is formed on the substrate 101 by a field oxide film 102A between a region 100A on which an active device such as a MOS transistor is to be formed and a region 100B on which the MOS-type capacitance device is to be formed. Further, n$^+$-type diffusion regions 101A and 101B are formed on the surface of the Si substrate 101 in correspondence to the region 100A, while an n$^+$-type diffusion region 101C and a p$^+$-type diffusion region 101D are formed on the region 100B. Further, a gate electrode 103A of Al, polysilicon or WSi is formed on the thermal oxide film 102 in a part between the diffusion regions 101A and 101B, and a capacitor electrode 103B is formed between the diffusion regions 101C and 101D from the same material as the gate electrode 103A. Further, the diffusion regions 101C and 101D are connected commonly in the region 100B and a MOS-type capacitance device having a complementary connection similar to the one explained with reference to the first embodiment is formed in the foregoing region 100B.

SEVENTH EMBODIMENT

Figure 19:
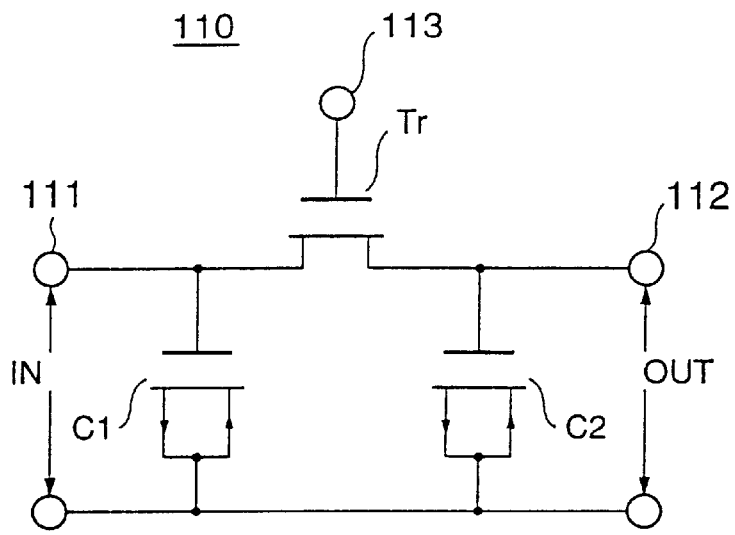
FIG. 19 is a circuit diagram showing the construction of a transfer gate circuit according to a seventh embodiment of the present invention in which the semiconductor integrated circuit of FIG. 18 is used.

FIG. 19 shows the construction of a transfer gate circuit 110 using the complementary-connected MOS-type capacitance device 100B of FIG. 18 according to a seventh embodiment of the present invention.

Referring to FIG. 19, a signal supplied to an input terminal 111 is held in a capacitor C1 corresponding to the complementary-connected MOS-type capacitance device 100B of FIG. 18 in the form of electric charges, while the electric charges thus held in the capacitor C1 are transferred to a similar capacitor C2 at an output side via a MOS transistor Tr which causes a conduction in response to a control signal supplied to the input terminal 113. With this, an output signal appears on the output terminal 112 connected to the capacitor C2.

EIGHTH EMBODIMENT

Figure 20:
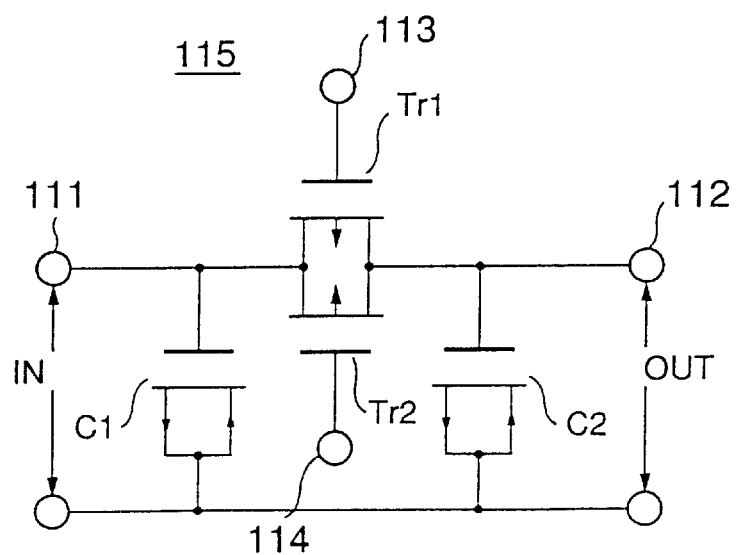
FIG. 20 is a circuit diagram showing the construction of a transfer gate circuit according to an eighth embodiment of the present invention in which the semiconductor integrated circuit of FIG. 18 is used.

FIG. 20 shows the construction of a transfer gate circuit 115 according to an eighth embodiment of the present invention wherein the transfer gate circuit 115 of the present embodiment is a modification of the transfer gate circuit 110 of FIG. 19.

Referring to FIG. 20, the present embodiment replaces the transistor Tr of the circuit of FIG. 19 with a construction in which a p-channel MOS transistor Tr1 and an n-channel MOS transistor Tr2 are connected parallel. Thereby, the transistor Tr1 is controlled for the conduction by a first control signal supplied to an input terminal 113, while the transistor Tr2 is controlled for the conduction by a second control signal supplied to an input terminal 114.

Other features of the circuit 112 are the same as those of the circuit 110 and description thereof will be omitted.

NINTH EMBODIMENT

Figure 21:
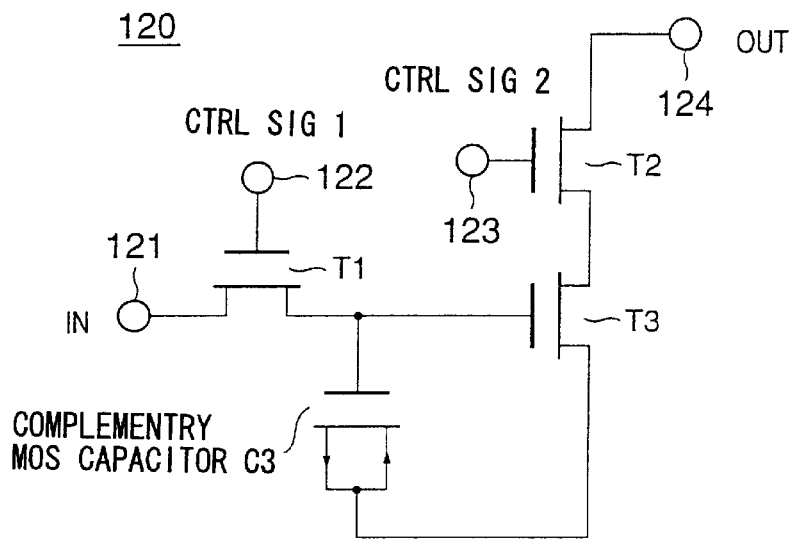
FIG. 21 is a circuit diagram showing the construction of a sampling circuit according to a ninth embodiment of the present invention in which the semiconductor integrated circuit of FIG. 18 is used.

FIG. 21 shows an example of a sampling circuit 120 according to a ninth embodiment of the present invention that uses the complementary connected MOS-type capacitance device 100B of FIG. 18.

Referring to FIG. 21, an input signal supplied to an input terminal 121 is forwarded to a complementary MOS-capacitance device C3 via a MOS transistor Ti, which causes a conduction in response to a control signal supplied to a control signal terminal 122, and is held in the MOS-type capacitance device C3 in the form of electric charges. The electric charges held in the capacitance device C3 cause a conduction in the MOS transistor T3. Thus, by causing a conduction in the MOS transistor T2 connected in series to the transistor T3 in response to a sampling signal supplied to a control signal terminal 123 of the transistor T2, the electric charges in the capacitance device C3 are supplied to an output terminal 124 via the transistor T2.

TENTH EMBODIMENT

Figure 22:
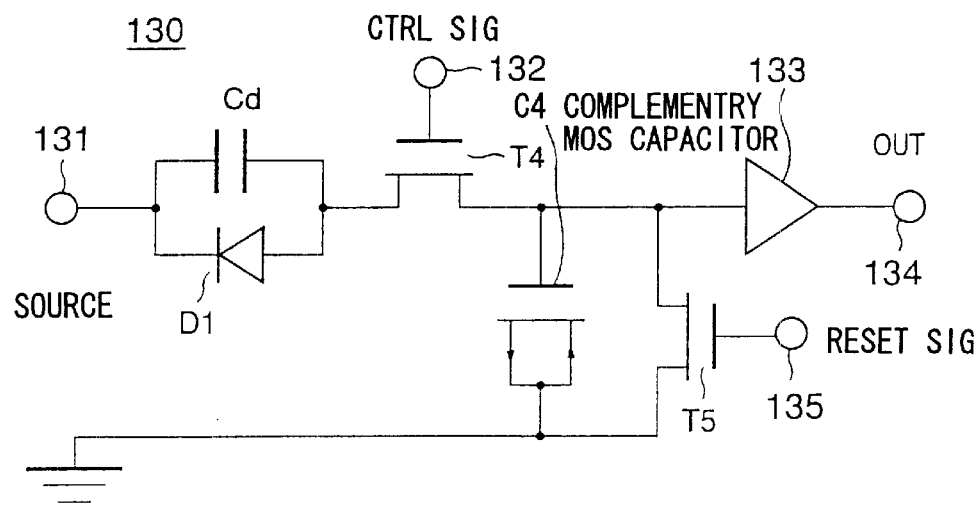
FIG. 22 is a circuit diagram showing the construction of an opto-electric conversion circuit according to a tenth embodiment of the present invention in which the semiconductor integrated circuit of FIG. 18 is used.

FIG. 22 shows the construction of an opto-electric conversion circuit 130 according to a tenth embodiment of the present invention that uses the complementary-connected MOS-type capacitance device 100B of FIG. 18.

Referring to FIG. 22, the opto-electric conversion circuit 130 includes a photodiode D1 biased by a bias voltage supplied to a bias power terminal 131, and the bias voltage on the bias power terminal 131 is supplied to a capacitor C4 via a MOS transistor T4, which causes a conduction in response to a control signal supplied to a control signal terminal 132, when the photodiode D1 has caused a conduction by an incoming optical signal. In response thereto, the capacitor C4 is charged up. The capacitor C4 has a construction corresponding to the complementary connected MOS-type capacitance device 100B of FIG. 18.

In the circuit of FIG. 22, the electric charges thus held in the capacitor C4 are read out by an amplifier 133 and an output signal is obtained at an output terminal 134. The circuit 130 includes a MOS transistor T5 that discharges the capacitor c4 and the transistor T5 causes a conduction in response to a reset signal supplied to a reset terminal 135.

ELEVENTH EMBODIMENT

Figure 23:
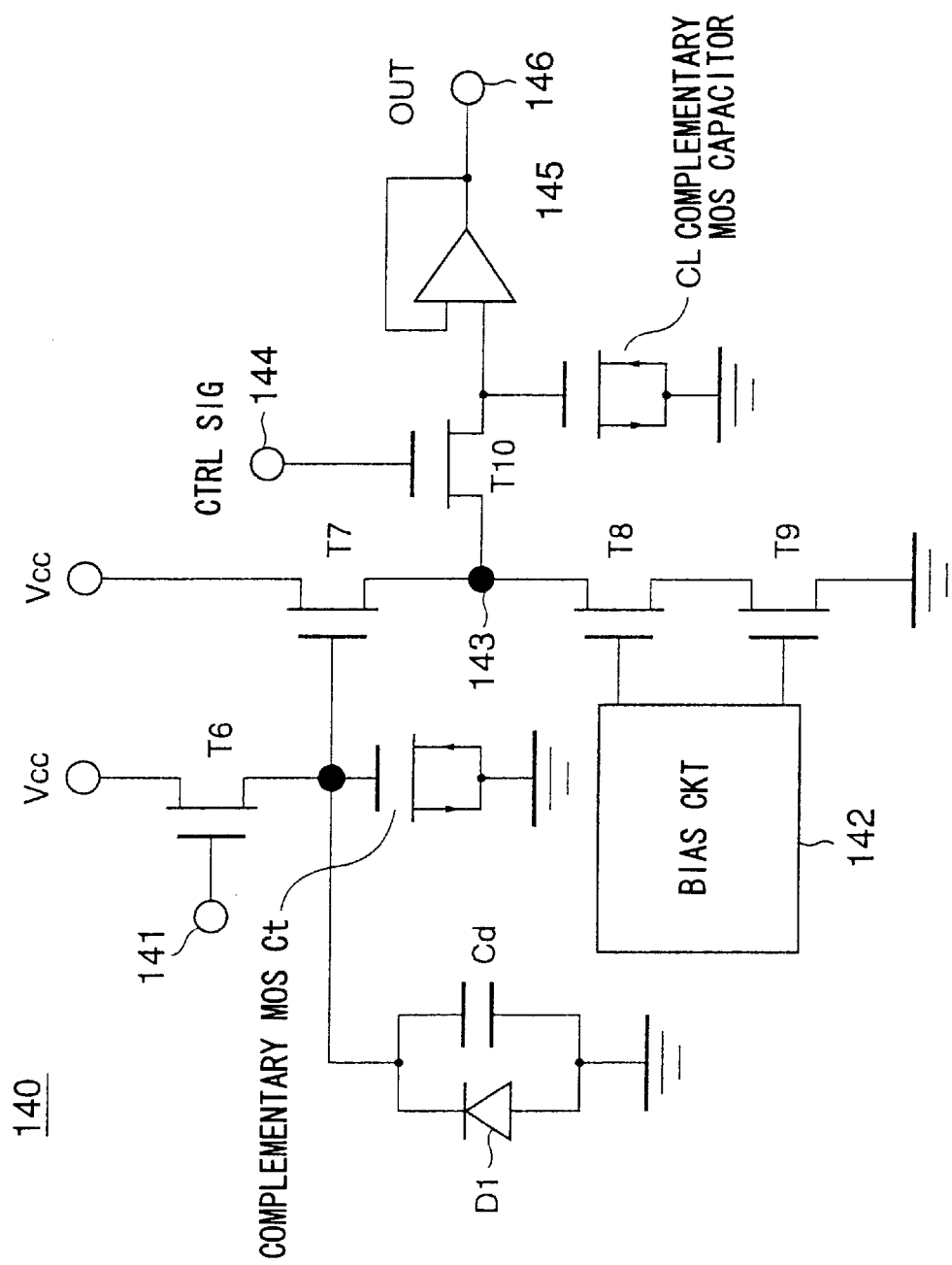
FIG. 23 is a circuit diagram showing the construction of an opto-electric conversion circuit according to an eleventh embodiment of the present invention in which the semiconductor integrated circuit of FIG. 18 is used.

FIG. 23 shows the construction of an opto-electric conversion circuit 140 according to an eleventh embodiment of the present invention that uses the complementary-connected MOS-type capacitance device 100B of FIG. 18.

Referring to FIG. 23, the opto-electric circuit 140 includes a capacitor Ct corresponding to the complementary-connected MOS-type capacitance device 100B of FIG. 18, wherein the capacitor Ct is charged via a MOS transistor T6, which causes a conduction in response to a reset signal supplied to a reset terminal 141. The photodiode D1 is connected parallel to the capacitor Ct.

When an optical signal comes in to the photodiode D1, the capacitor Ct is discharged, and a MOS transistor T7 supplied with a supply voltage and cooperating with the capacitor Ct is turned off. It should be noted that a transistor T7 is inserted between the transistor T7 and a ground potential in series with transistors T8 and T9, which are urged by a bias circuit 142 to a conduction state. Thus, when the transistor T7 turns off, the potential of the node 143 between the transistors T7 and T8 goes low. When the transistor T10 causes a conduction in response to the control signal supplied to the control terminal 144 in this state, a capacitor CL corresponding to complementary-connected MOS-type capacitance device 100B connected to the output-side of the transistor T10 experiences a discharging via the transistor T10 and the transistors T8 and T7. Thereby, the amplifier 145 detects the potential change of the capacitor CL and supplied to an output terminal 146 as a low level output signal.

On the other hand, the capacitor Ct is in a charged-up state in the circuit 140 of FIG. 23 when the optical signal does not comes in to the photodiode D1 and the transistor T7 causes a conduction as a result. Thereby, charge up of the capacitor CL is conducted via the transistor T10. In this state, a high-level output signal is obtained at the output terminal 146.

TWELFTH EMBODIMENT

Figure 24A:
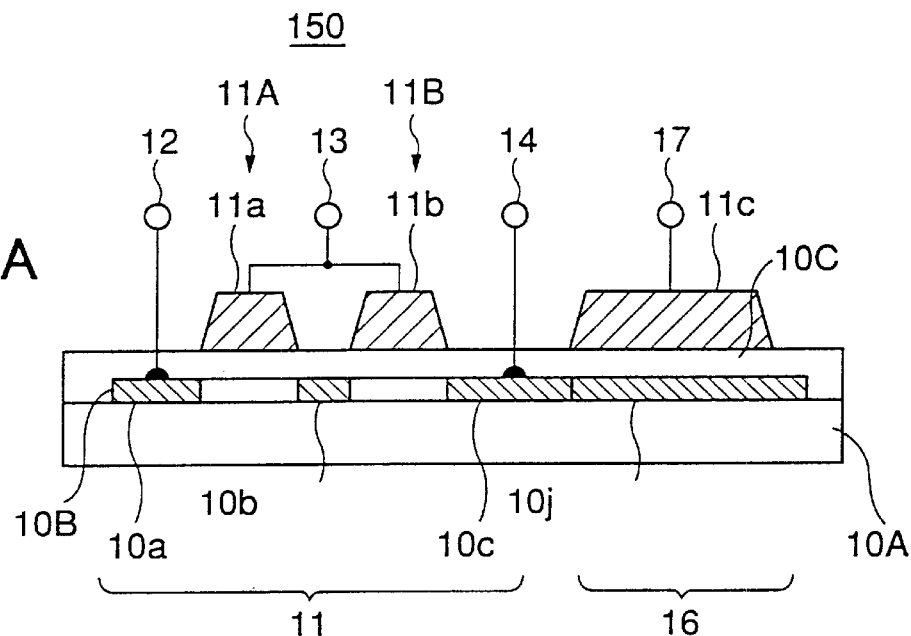
FIGS. 24A and 24B respectively are a cross-sectional diagram and a plan-view diagram of a liquid crystal cell driving circuit of an active-matrix driven liquid crystal display device according to a twelfth embodiment of the present invention.
Figure 24B:
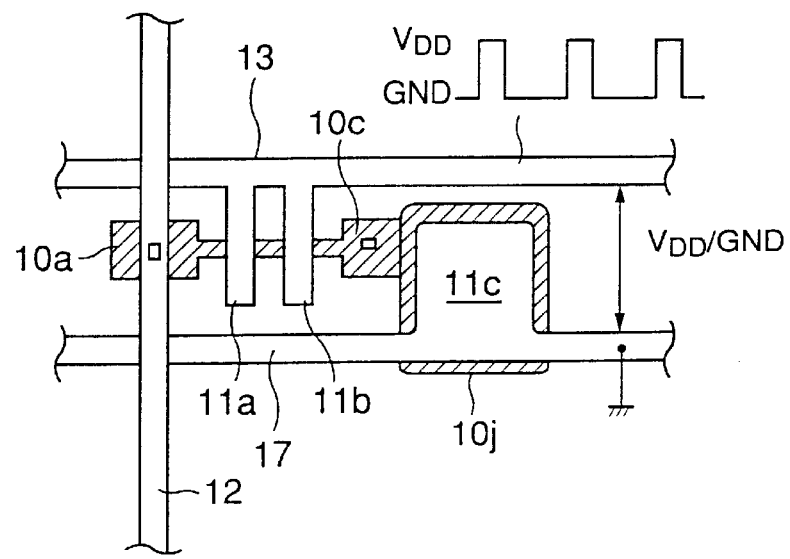

FIGS. 24A and 24B show the construction of a liquid crystal cell driving circuit 150 according to a twelfth embodiment of the present invention respectively in a cross-sectional view and in a plan view.

Referring to FIGS. 24A and 24B, the p$^+$-type diffusion region 10$i$ extends, in the driving circuit 50 of FIG. 14A, to a part underneath the capacitor electrode 11c and forms a p$^+$-type diffusion region 10$j$ continuing to the n$^+$-type diffusion region 10c.

In the construction of FIGS. 24A and 24B, the capacitance line 17 is held at the ground level and the selection signal supplied to the control line 13 changes between the ground level and the supply voltage level VDD as represented in FIG. 24B. Thereby, the voltage applied across the control line (scanning electrode) 13 and the capacitance line 17 takes a maximum level of VDD, and the stress applied to an insulating film or interlayer insulation film in the liquid crystal display device is reduced.

Further, the present invention is not limited to specific preferred embodiments described heretofore, but various variations and modifications may be made without departing from the scope of the invention described in the form of claims.

INDUSTRIAL APPLICABILITY

According to a first aspect of the present invention, the MOS-type capacitance device of the present invention shows a substantially identical capacitance to a positive voltage or negative voltage, or to a low-frequency signal or a high-frequency signal by making a complementary connection, and functions as an effective capacitor. Further, the MOS-type capacitance device of the present invention can be fabricated simultaneously with a fabrication process of other MOS transistors, without adding steps. As the type diffusion region and the p$^+$-type diffusion region are formed by an ion implantation process after covering the semiconductor layer by an insulating film in the MOS-type capacitance device of the present embodiment, the problem pertinent to prior art of contamination of the semiconductor layer by an impurity element does not occur. Associated with this, the problem of variation of the threshold voltage or other operational characteristic of the transistor formed on the semiconductor layer simultaneously to the MOS-type capacitance device, caused by the contamination by the impurity element, is eliminated. Further, when the MOS-type capacitance device of the present invention is used for driving a liquid crystal display device, it is sufficient to hold the capacitor electrode at the common potential level, and the stress applied to the capacitor insulation film or other interlayer insulation film is reduced and the problem of degradation of display characteristic caused by the stress is avoided.

According to a second aspect of the present invention, it is possible to reduce the manufacturing cost of the liquid crystal display device by using the MOS-type capacitance device in the liquid crystal display device. Such a liquid crystal display device has an improved reliability due to decreased stress in the gate insulation film, capacitor insulation film or other interlayer insulation film and can be manufactured with improved yield.

According to a third aspect of the present invention, it is possible to fabricate a projection-type liquid crystal display device using the MOS-type capacitance device of the present invention without increasing the number of steps and with a low cost. The liquid crystal display device has an improved reliability due to reduced gate insulation film, capacitor insulation film or other interlayer insulation film, and can be manufactured with improved yield.

Further, according to a fourth aspect of the present invention, various semiconductor integrated circuits can be fabricated by using the MOS-type capacitance device.

Further, according to a fifth aspect of the present invention, it is possible to make a MOS-type capacitance device of the present invention, or a liquid crystal display device using the same, or a semiconductor integrated circuit using the same.

What is claimed is:

1. A MOS-type capacitance device, comprising:

a substrate, an electrode formed on the substrate, an insulating film formed on the substrate so as to cover the electrode, semiconductor layer formed on the insulating film, a first diffusion region formed in the semiconductor layer adjacent to a first edge of the electrode, and a second diffusion region formed in the semiconductor layer adjacent to another edge of the electrode, the first diffusion region being doped to a first conductivity type, the second diffusion region being doped to a second, opposite conductivity type, wherein the electrode is connected to a first input terminal, wherein the first and second diffusion regions are connected commonly to a second input terminal.

2. A MOS-type capacitance device as claimed in claim 1, wherein the first diffusion region is formed in the semiconductor layer in substantial alignment with a first edge formed at a first side of the electrode, and wherein the second diffusion region is formed in the semiconductor layer in substantial alignment with a second edge formed at a second side of the electrode.

3. A liquid crystal display device, comprising:
first glass substrate,
second glass substrate opposing the first glass substrate,
a liquid crystal layer confined between the first glass substrate and the second glass substrate,
a signal electrode extending on the first glass substrate,
a scanning electrode extending on the first glass substrate,
a common potential line extending on the first glass substrate,
a thin-film transistor formed at an intersection of the signal electrode line and the scanning electrode,
a pixel electrode electrically connected to the thin-film transistor, and
an accumulating capacitance connected to the pixel electrode,
the thin-film transistor being formed by a semiconductor layer formed on the first glass substrate,
the accumulating capacitance comprising:
an insulating film formed on the semiconductor layer,
a capacitor electrode formed on the insulating film,
a first diffusion region formed in the semiconductor layer adjacent to the capacitor electrode, and
a second diffusion region formed in the semiconductor layer adjacent to the capacitor electrode,
the first diffusion region being doped to a first conductivity type, the second diffusion region being doped to a second, opposite conductivity type;
wherein the capacitor electrode is connected to a first input terminal,
wherein the first and second diffusion regions are connected commonly to a second input terminal.

4. A liquid crystal display device as claimed in claim 3, wherein the thin film transistor comprises a third diffusion region having the first conductivity type formed in the semiconductor layer with a separation form the first diffusion region by a channel region, and a gate electrode formed on the insulating film so as to cover the channel region in the semiconductor layer, the first and second diffusion regions being connected commonly to the pixel electrode, the capacitor electrode being connected to the common potential line, the third diffusion region being connected to the signal line, the gate electrode being connected to the scanning electrode.

5. A liquid crystal display device as claimed in claim 3, wherein the first diffusion region is formed in the semiconductor layer in substantial alignment with a first edge at a first side of the capacitor electrode, and wherein the second diffusion region is formed in the semiconductor layer in substantial alignment with a second edge formed at another side of the capacitor electrode.

6. A liquid crystal display device as claimed in claim 3, wherein the first diffusion region is formed in the semiconductor layer at an outer side of a first edge of the capacitor electrode formed at a first side of the capacitor electrode with a first LDD region of the first conductivity type interposed between the first diffusion region and a region right underneath the electrode, and wherein the second diffusion region is formed in the semiconductor layer at an outer side of a second edge of the capacitor electrode formed at another side of the capacitor electrode with a second LDD region of the second conductivity type interposed between the second diffusion region and the region right underneath the electrode.

7. A liquid crystal display device as claimed in claim 3, wherein the first diffusion region is-formed in the semiconductor layer at an outer side of a first edge of the capacitor electrode formed at a first side of the capacitor electrode with first offset region interposed between the first diffusion region and a region right underneath the electrode, and wherein the second diffusion region is formed in the semiconductor layer at an outer side of a second edge of the capacitor electrode formed at another side of the capacitor electrode with a second offset region interposed between the second diffusion region and the region right underneath the electrode.

8. A liquid crystal display device as claimed in claim 5, wherein the first diffusion region and the second diffusion region are formed adjacent to an edge of the capacitor electrode with a mutually adjacent relationship.

9. A projection-type liquid crystal display device, comprising:
an optical source,
a liquid crystal panel disposed in an optical path of an optical beam produced by the optical source for spatial modulation, and
a projecting optical system projecting the optical beam that has been spatially modulated by the liquid crystal panel,
the liquid crystal panel comprising:
a first glass substrate,
a second glass substrate opposing the first glass substrate,
a liquid crystal layer confined between the first glass substrate and the second glass substrate,
a signal electrode extending on the first glass substrate,
a scanning electrode extending on the second glass substrate,
a common potential line extending on the first glass substrate,
a thin-film transistor formed at an intersection of the signal electrode line and the scanning electrode,
a pixel electrode electrically connected to the thin-film transistor, and
an accumulating capacitance connected to the pixel electrode,
the thin-film transistor being formed by a semiconductor layer formed on the first glass substrate,
the accumulating capacitance comprising:
an insulating film formed on the semiconductor layer,
a capacitor electrode formed on the insulating film,
a first diffusion region formed in the semiconductor layer adjacent to the capacitor electrode, and
a second diffusion region formed in the semiconductor layer adjacent to the capacitor electrode,
the first diffusion region being doped to a first conductivity type, the second diffusion region being doped toga second, opposite conductivity type,
wherein the capacitor electrode is connected to a first input terminal,
wherein the first and second diffusion regions are connected commonly to a second input terminal.

10. A projection-type liquid crystal display device as claimed in claim 9, wherein the thin film transistor comprises a third diffusion region having the first conductivity type formed-in the semiconductor layer with a separation form the first diffusion region by a channel region, and a gate electrode formed on the insulating film so as to cover the channel region in the semiconductor layer, the first and second diffusion regions being connected commonly to the pixel electrode, the capacitor electrode being connected to the common potential line, the third diffusion region being connected to the signal line, the gate electrode being connected to the scanning electrode.

11. A projection-type liquid crystal display device as claimed in claim 9, wherein the first diffusion region is formed in the semiconductor layer in substantial alignment with a first edge at a first side of the capacitor electrode, and wherein the second diffusion- region is formed in the semiconductor layer in substantial alignment with a second edge formed at another side of the capacitor electrode.

12. A projection-type liquid crystal display device as claimed in claim 9, wherein the first diffusion region is formed in the semiconductor layer at an outer side of a first edge of the capacitor electrode formed at a first side of the capacitor electrode with a first LDD region of the first conductivity type interposed between the first diffusion region and a region right underneath the electrode, and wherein the second diffusion region is formed in the semiconductor layer at an outer side of a second edge of the capacitor electrode formed at another side of the capacitor electrode with a second LDD region of the second conductivity type interposed between the second diffusion region and the region right underneath the electrode.

13. A projection-type liquid crystal display device as claimed in claim 9, wherein the first diffusion region is formed in the semiconductor layer at an outer side of a first edge of the capacitor electrode formed at a first side of the capacitor electrode with a first offset region interposed between the first diffusion region and a region right underneath the electrode, and wherein the second diffusion region is formed in the semiconductor layer at an outer side of a second edge of the capacitor electrode formed at another side of the capacitor electrode with a second offset region interposed between the second diffusion region and the region right underneath the electrode.

14. A projection-type liquid crystal display device as claimed in claim 9, wherein the first diffusion region and the second diffusion region are formed adjacent to an edge of the capacitor electrode with a mutually adjacent relationship.

* * * * *

UNITED STATES PATENT AND TRADEMARK OFFICE
CERTIFICATE OF CORRECTION

PATENT NO. : 6,603,160 B1
DATED : August 5, 2003
INVENTOR(S) : Hongyong Zhang

It is certified that error appears in the above-identified patent and that said Letters Patent is hereby corrected as shown below:

Column 21,
Line 46, delete "form" and insert -- from --.

Column 22,
Line 19, delete "claim 5" and insert -- claim 3 --.

Column 23,
Line 2, delete "formed-in" and insert -- formed in --.
Line 3, delete "form" and insert -- from --.
Line 15, delete "diffusion-region" and insert -- diffusion region --.

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,603,160 B1
DATED : August 5, 2003
INVENTOR(S) : Hongyong Zhang

It is certified that error appears in the above-identified patent and that said Letters Patent is hereby corrected as shown below:

Column 22,
Line 9, delete "is-formed" and insert -- is formed -- therefor.

Signed and Sealed this

Fourteenth Day of December, 2004

JON W. DUDAS
*Director of the United States Patent and Trademark Office*